US008659338B2

(12) United States Patent
Papaefthymiou et al.

(10) Patent No.: US 8,659,338 B2
(45) Date of Patent: *Feb. 25, 2014

(54) RESONANT CLOCK DISTRIBUTION NETWORK ARCHITECTURE WITH PROGRAMMABLE DRIVERS

(75) Inventors: Marios C. Papaefthymiou, Ann Arbor, MI (US); Alexander Ishii, Princeton, NJ (US)

(73) Assignee: Cyclos Semiconductor, Inc., Berkeley, CA (US)

( * ) Notice: Subject to any disclaimer, the term of this patent is extended or adjusted under 35 U.S.C. 154(b) by 139 days.

This patent is subject to a terminal disclaimer.

(21) Appl. No.: 12/903,154

(22) Filed: Oct. 12, 2010

(65) Prior Publication Data

US 2011/0140753 A1  Jun. 16, 2011

Related U.S. Application Data

(60) Provisional application No. 61/250,830, filed on Oct. 12, 2009.

(51) Int. Cl.
*G06F 1/04* (2006.01)
*H03H 11/26* (2006.01)

(52) U.S. Cl.
USPC ............................................ 327/291; 327/261

(58) Field of Classification Search
USPC ................................................. 327/261, 291
See application file for complete search history.

(56) References Cited

U.S. PATENT DOCUMENTS

| 4,611,135 | A | 9/1986 | Nakayama et al. |
| 5,023,480 | A | 6/1991 | Gieseke et al. |
| 5,036,217 | A | 7/1991 | Rollins et al. |
| 5,111,072 | A | 5/1992 | Seidel |
| 5,122,679 | A | 6/1992 | Ishii et al. |
| 5,146,109 | A | 9/1992 | Martignoni et al. |
| 5,311,071 | A | 5/1994 | Ueda |
| 5,332,916 | A | 7/1994 | Hirai |
| 5,384,493 | A | 1/1995 | Furuki |
| 5,396,527 | A | 3/1995 | Schlecht et al. |

(Continued)

FOREIGN PATENT DOCUMENTS

| EP | 0953892 | 11/1999 |
| EP | 1126612 | 8/2001 |

(Continued)

OTHER PUBLICATIONS

Athas et al., "Low-Power Digital Systems Based on Adiabatic-Switching Principles," IEEE Transactions on Very Large Scale Integration (VLSI) Systems, vol. 2, No. 4, pp. 398-407, Dec. 1994.

(Continued)

*Primary Examiner* — Hai L Nguyen
(74) *Attorney, Agent, or Firm* — Sheppard, Mullin, Richter & Hampton LLP

(57) ABSTRACT

A resonant clock distribution network architecture is proposed that uses clock drivers of programmable size and reference clocks of programmable duty cycle to achieve a target clock rise time and clock amplitude with low energy consumption when operating in any one of multiple clock frequencies in resonant or non-resonant mode. Such a network is generally applicable to semiconductor devices with various clock frequencies, and high-performance and low-power clocking requirements such as microprocessors, ASICs, and SOCs.

23 Claims, 17 Drawing Sheets

(56) References Cited

U.S. PATENT DOCUMENTS

| | | |
|---|---|---|
| 5,410,491 A | 4/1995 | Minami |
| 5,430,408 A | 7/1995 | Ovens et al. |
| 5,473,526 A | 12/1995 | Svensson et al. |
| 5,489,866 A | 2/1996 | Diba |
| 5,504,441 A | 4/1996 | Sigal |
| 5,506,520 A | 4/1996 | Frank et al. |
| 5,506,528 A | 4/1996 | Cao et al. |
| 5,508,639 A | 4/1996 | Fattaruso |
| 5,517,145 A | 5/1996 | Frank |
| 5,517,399 A | 5/1996 | Yamauchi et al. |
| 5,526,319 A | 6/1996 | Dennard et al. |
| 5,537,067 A | 7/1996 | Carvajal et al. |
| 5,559,463 A | 9/1996 | Denker et al. |
| 5,559,478 A | 9/1996 | Athas et al. |
| 5,587,676 A | 12/1996 | Chowdhury |
| 5,675,263 A | 10/1997 | Gabara |
| 5,701,093 A | 12/1997 | Suzuki |
| 5,734,285 A | 3/1998 | Harvey |
| 5,760,620 A | 6/1998 | Doluca |
| 5,838,203 A | 11/1998 | Stamoulis et al. |
| 5,841,299 A | 11/1998 | De |
| 5,872,489 A | 2/1999 | Chang et al. |
| 5,892,387 A | 4/1999 | Shigehara et al. |
| 5,896,054 A | 4/1999 | Gonzalez |
| 5,970,074 A | 10/1999 | Ehiro |
| 5,986,476 A | 11/1999 | De |
| 5,999,025 A | 12/1999 | New |
| 6,009,021 A | 12/1999 | Kioi |
| 6,009,531 A | 12/1999 | Selvidge et al. |
| 6,011,441 A | 1/2000 | Ghoshal |
| 6,037,816 A | 3/2000 | Yamauchi |
| 6,052,019 A | 4/2000 | Kwong |
| 6,069,495 A | 5/2000 | Ciccone et al. |
| 6,091,629 A | 7/2000 | Osada et al. |
| 6,150,865 A | 11/2000 | Fluxman et al. |
| 6,160,422 A | 12/2000 | Huang |
| 6,169,443 B1 | 1/2001 | Shigehara et al. |
| 6,177,819 B1 | 1/2001 | Nguyen |
| 6,230,300 B1 | 5/2001 | Takano |
| 6,242,951 B1 | 6/2001 | Nakata et al. |
| 6,278,308 B1 | 8/2001 | Partovi et al. |
| 6,323,701 B1 | 11/2001 | Gradinariu et al. |
| RE37,552 E | 2/2002 | Svensson et al. |
| 6,433,586 B2 | 8/2002 | Ooishi |
| 6,438,422 B1 | 8/2002 | Schu et al. |
| 6,477,658 B1 | 11/2002 | Pang |
| 6,538,346 B2 | 3/2003 | Pidutti et al. |
| 6,542,002 B2 | 4/2003 | Jang et al. |
| 6,559,681 B1 | 5/2003 | Wu et al. |
| 6,563,362 B2 | 5/2003 | Lambert |
| 6,608,512 B2 | 8/2003 | Ta et al. |
| 6,720,815 B2 | 4/2004 | Mizuno |
| 6,742,132 B2 | 5/2004 | Ziesler et al. |
| 6,777,992 B2 | 8/2004 | Ziesler et al. |
| 6,856,171 B1 | 2/2005 | Zhang |
| 6,879,190 B2 | 4/2005 | Kim et al. |
| 6,882,182 B1 | 4/2005 | Conn et al. |
| 7,005,893 B1 | 2/2006 | Athas et al. |
| 7,145,408 B2 | 12/2006 | Shepard et al. |
| 7,215,188 B2 | 5/2007 | Ramaraju et al. |
| 7,227,425 B2 | 6/2007 | Jang et al. |
| 7,233,186 B2 | 6/2007 | Ishimi |
| 7,301,385 B2 | 11/2007 | Takano et al. |
| 7,307,486 B2 | 12/2007 | Pernia et al. |
| 7,355,454 B2 | 4/2008 | Papaefthymiou et al. |
| 7,567,110 B2 * | 7/2009 | Shionoya ............ 327/295 |
| 7,622,997 B2 | 11/2009 | Papaefthymiou et al. |
| 7,696,734 B2 | 4/2010 | Endo et al. |
| 7,719,316 B2 | 5/2010 | Chueh et al. |
| 7,719,317 B2 | 5/2010 | Chueh et al. |
| 7,956,664 B2 | 6/2011 | Chueh et al. |
| 7,973,565 B2 | 7/2011 | Ishii et al. |
| 8,089,323 B2 | 1/2012 | Tarng et al. |
| 8,237,484 B2 * | 8/2012 | Kaviani et al. ............ 327/291 |
| 8,350,632 B1 | 1/2013 | Kim |
| 8,362,811 B2 * | 1/2013 | Papaefthymiou et al. .... 327/108 |
| 2001/0013795 A1 | 8/2001 | Nojiri |
| 2002/0140487 A1 | 10/2002 | Fayneh et al. |
| 2003/0189451 A1 | 10/2003 | Ziesler et al. |
| 2005/0057286 A1 | 3/2005 | Shepard et al. |
| 2005/0088231 A1 | 4/2005 | Ziegler |
| 2005/0114820 A1 | 5/2005 | Restle |
| 2006/0082387 A1 | 4/2006 | Papaefthymiou et al. |
| 2006/0152293 A1 | 7/2006 | McCorquodale et al. |
| 2007/0096957 A1 | 5/2007 | Papaefthymiou et al. |
| 2007/0168786 A1 | 7/2007 | Drake et al. |
| 2007/0216462 A1 | 9/2007 | Ishimi |
| 2008/0136479 A1 | 6/2008 | You et al. |
| 2008/0150605 A1 | 6/2008 | Chueh et al. |
| 2008/0150606 A1 | 6/2008 | Kumata |
| 2008/0164921 A1 | 7/2008 | Shin |
| 2008/0303576 A1 | 12/2008 | Chueh et al. |
| 2009/0027085 A1 | 1/2009 | Ishii et al. |
| 2011/0084736 A1 * | 4/2011 | Papaefthymiou et al. .... 327/108 |
| 2011/0084772 A1 | 4/2011 | Papaefthymiou et al. |
| 2011/0084773 A1 | 4/2011 | Papaefthymiou et al. |
| 2011/0084774 A1 | 4/2011 | Papaefthymiou et al. |
| 2011/0084775 A1 | 4/2011 | Papaefthymiou et al. |
| 2011/0090018 A1 | 4/2011 | Papaefthymiou et al. |
| 2011/0090019 A1 | 4/2011 | Papaefthymiou et al. |
| 2011/0109361 A1 | 5/2011 | Nishio |
| 2011/0140753 A1 | 6/2011 | Papaefthymiou et al. |
| 2011/0210761 A1 | 9/2011 | Ishii et al. |
| 2011/0215854 A1 | 9/2011 | Chueh et al. |
| 2013/0229189 A1 | 9/2013 | Pang et al. |

FOREIGN PATENT DOCUMENTS

| | | |
|---|---|---|
| EP | 1764669 | 3/2007 |
| JP | 63246865 | 10/1988 |
| JP | 7321640 A | 12/1995 |
| JP | 3756285 | 1/2006 |
| WO | 2005092042 | 10/2005 |

OTHER PUBLICATIONS

Chan et al., "1.1 to 1.6GHz Distributed Differential Oscillator Global Clock Network," International Solid-State Circuits Conference, pp. 518-519, Feb. 9, 2005.

Chan et al., "A 4.6GHz Resonant Global Clock Distribution Network," IEEE International Solid-State Circuits Conference, Feb. 18, 2004.

Chan et al., "A Resonant Global Clock Distribution for the Cell Broadband Engine Processor," IEEE Journal of Solid State Circuits, vol. 44, No. 1, pp. 64-72, Jan. 2009.

Chan et al., "Design of Resonant Global Clock Distributions," Proceedings of the 21st International Conference on Computer Design, pp. 248-253, Oct. 2003.

Chueh et al., "900MHz to 1.2GHz Two-Phase Resonant Clock Network with Programmable Driver and Loading," IEEE Custom Integrated Circuits Conference, pp. 777-780, Sep. 2006.

Chueh et al., "Two-Phase Resonant Clock Distribution," Proceedings of the IEEE Computer Society Annual Symposium on VLSI: New Frontiers on VLSI Design, May 2005.

Cooke et al., "Energy Recovery Clocking Scheme and Flip-Flops for Ultra Low-Energy Application," International Symposium on Low-Power Electronic Design, pp. 54-59, Aug. 25-27, 2003.

Drake et al., "Resonant Clocking Using Distributed Parasitic Capacitance," IEEE Journal of Solid-State Circuits, vol. 39, No. 9, pp. 1520-1528, Sep. 2004.

Dunning, Jim, "An All-Digital Phase-Locked Loop with 50-Cycle Lock Time Suitable for High-Performance Microprocessors," IEEE Journal of Solid-State Circuits, vol. 30, No. 4, pp. 412-422, Apr. 1995.

Fang et al., "A High-Performance Asynchronous FPGA: Test Results," Proceedings of the 13th Annual IEEE Symposium on Field-Programmable Custom Computing Machines, Apr. 2005.

Favalli et al., "Testing Scheme for IC's Clocks," IEEE European Design and Test Conference, Mar. 1997.

Gutnik et al., "Active GHz Clock Network Using Distributed PLLs," IEEE Journal of Solid-State Circuits, vol. 35, No. 11, pp. 1553-1560, Nov. 2000.

(56) References Cited

OTHER PUBLICATIONS

Ishii et al., "A Resonant-Clock 200MHz ARM926EJ-S(TM) Microcontroller," European Solid-State Circuits Conference, Sep. 2009.
Kim et al., "Energy Recovering Static Memory," Proceedings of the 2002 International Symposium on Low Power Electronics and Design, pp. 92-97, Aug. 12-14, 2002.
Maksimovic et al., "Design and Experimental Verification of a CMOS Adiabatic Logic with Single-Phase Power-Clock Supply," Proceedings of the 40th Midwest Symposium on Circuits and Systems, pp. 417-420, Aug. 1997.
Maksimovic et al., "Integrated Power Clock Generators for Low Energy Logic," IEEE Annual Power Electronics Specialists Conference, vol. 1, pp. 61-67, Jun. 18-22, 1995.
Moon et al., "An Efficient Charge Recovery Logic Circuit," IEEE Journal of Solid-State Circuits, vol. 31, No. 4, pp. 514-522, Apr. 1996.
Sathe et al., "A 0.8-1.2GHz Frequency Tunable Single-Phase Resonant-Clocked FIR Filter with Level-Sensitive Latches," IEEE 2007 Custom Integrated Circuits Conference, pp. 583-586, Sep. 2007.
Sathe et al., "A 1.1GHz Charge-Recovery Logic," IEEE International Solid-State Circuits Conference, Feb. 7, 2006.
Sathe et al., "A 1GHz Filter with Distributed Resonant Clock Generator," IEEE Symposium on VLSI Circuits, pp. 44-45, Jun. 2007.
Teifel et al., "Highly Pipelined Asynchronous FPGAs," Proceedings of the 2004 ACM/SIGDA 12th International Symposium on Field Programmable Gate Arrays, pp. 133-142, Feb. 22-24, 2004.
Weste et al., "Principles of CMOS VLSI Design: A Systems Perspective," 2nd Edition, Addison-Wesley, pp. 9-11, 1992.
Ziesler et al., "A 225 MHz Resonant Clocked ASIC Chip," Proceedings of the 2003 International Symposium on Low Power Electronics and Design, pp. 48-53, Aug. 25-27, 2003.
Ziesler et al., "A Resonant Clock Generator for Single-Phase Adiabatic Systems," Proceedings of the 2001 International Symposium on Low Power Electronics and Design, pp. 159-164, Aug. 6-7, 2001.
Ziesler et al., "Energy Recovering ASIC Design," Proceedings of the IEEE Computer Society Annual Symposium on VLSI, Feb. 20-21, 2003.
Search Report and Written Opinion from International Serial No. PCT/US2010/052405 mailed Jun. 23, 2011.
Search Report and Written Opinion from International Serial No. PCT/US2007/086304 mailed Mar. 3, 2009.
Search Report and Written Opinion from International Serial No. PCT/US2008/064766 mailed Dec. 22, 2008.
Search Report and Written Opinion from International Serial No. PCT/US2010/052393 mailed Jun. 23, 2011.
Search Report and Written Opinion from International Serial No. PCT/US2010/052395 mailed Jun. 23, 2011.
Search Report and Written Opinion from International Serial No. PCT/US2010/052396 mailed Jun. 23, 2011.
Search Report and Written Opinion from International Serial No. PCT/US2010/052397 mailed Jun. 23, 2011.
Search Report and Written Opinion from International Serial No. PCT/US2010/052401 mailed Jun. 29, 2011.
Search Report and Written Opinion from International Serial No. PCT/US2010/052402 mailed Jun. 23, 2011.
Search Report from International Serial No. PCT/US2003/010320 mailed Sep. 29, 2003.
Supplementary European Search Report from European Serial Number 03716979.4 mailed Jun. 7, 2006.
International Search Report and Written Opinion issued in PCT/US2010/052390 on Jun. 23, 2011.
Sathe, Visvesh S., et al. "Resonant-Clock Latch-Based Design," IEEE Journal of Solid-State Circuits, Apr. 2008, pp. 864-873, vol. 32, No. 4, IEEE.
Taskin, Baris et al., "Timing-Driven Physical Design for VLSI Circuits Using Resonant Rotary Clocking," 49th IEEE International Midwest Symposium on Circuits and Systems, pp. 261-265, Aug. 6, 2006.

\* cited by examiner

RESONANT CLOCK DISTRIBUTION NETWORK ARCHITECTURE WITH PROGRAMMABLE DRIVERS

CLAIM OF PRIORITY AND RELATED APPLICATIONS

This patent application is a conversion of and claims priority to U.S. Provisional Patent Application No. 61/250,830, entitled SYSTEMS AND METHODS FOR RESONANT CLOCKING INTEGRATED CIRCUITS, filed Oct. 12, 2009, which is incorporated herein in its entirety. This patent application is related to the technologies described in the following patents and applications, all of which are incorporated herein in their entireties:

U.S. patent application Ser. No. 12/125,009, entitled RESONANT CLOCK AND INTERCONNECT ARCHITECTURE FOR DIGITAL DEVICES WITH MULTIPLE CLOCK NETWORKS, filed Oct. 12, 2009, which claims priority to U.S. Provisional Patent Application No. 60/931,582, entitled RESONANT CLOCK AND INTERCONNECT ARCHITECTURE FOR PROGRAMMABLE LOGIC DEVICES, filed May 23, 2007;

U.S. patent application Ser. No. 12/903,158, entitled ARCHITECTURE FOR CONTROLLING CLOCK CHARACTERISTICS, filed Oct. 12, 2010;

U.S. patent application Ser. No. 12/903,163, entitled METHOD FOR SELECTING NATURAL FREQUENCY IN RESONANT CLOCK DISTRIBUTION NETWORKS WITH NO INDUCTOR OVERHEAD, filed Oct. 12, 2010;

U.S. patent application Ser. No. 12/903,166, entitled ARCHITECTURE FOR ADJUSTING NATURAL FREQUENCY IN RESONANT CLOCK DISTRIBUTION NETWORKS, filed Oct. 12, 2010;

U.S. patent application Ser. No. 12/903,168, entitled ARCHITECTURE FOR FREQUENCY-SCALED OPERATION IN RESONANT CLOCK DISTRIBUTION NETWORKS, filed Oct. 12, 2010;

U.S. patent application Ser. No. 12/903,172, entitled ARCHITECTURE FOR SINGLE-STEPPING IN RESONANT CLOCK DISTRIBUTION NETWORKS, filed Oct. 12, 2010;

U.S. patent application Ser. No. 12/903,174, entitled ARCHITECTURE FOR OPERATING RESONANT CLOCK NETWORK IN CONVENTIONAL MODE, filed Oct. 12, 2010; and U.S. patent application Ser. No. 12/903,188, entitled RESONANT CLOCK DISTRIBUTION NETWORK ARCHITECTURE FOR TRACKING PARAMETER VARIATIONS IN CONVENTIONAL CLOCK DISTRIBUTION NETWORKS filed Oct. 12, 2010.

FIELD OF INVENTION

This disclosure relates generally to clock distribution network architectures for digital devices with multiple clock networks and various clock frequencies such as microprocessors, application-specific integrated circuits (ASICs), and System-on-a-Chip (SOC) devices.

BACKGROUND OF THE INVENTION

Resonant clock distribution networks have recently been proposed for the energy-efficient distribution of clock signals in synchronous digital systems. In these networks, energy-efficient operation is achieved using one or more inductors to resonate the parasitic capacitance of the clock distribution network. Clock distribution with extremely low jitter is achieved through reduction in the number of clock buffers. Moreover, extremely low skew is achieved among the distributed clock signals through the design of relatively symmetric all-metal distribution networks. Overall network performance depends on operating speed and total network inductance, resistance, size, and topology, with lower-resistance symmetric networks resulting in lower jitter, skew, and energy consumption when designed with adequate inductance.

In resonant clock distribution networks, the amount of energy injected into the clock network depends on certain design parameters, including the size of the final clock drivers, and the duty cycle of the reference clock signals that drive the final clock drivers. Furthermore, in contrast to conventional (that is, non-resonant) clock distribution networks, the amount of energy injected into the resonant network also depends on the frequency at which the network is operated. In general, larger driver sizes or longer duty cycles allow for more current to build up in the inductive elements, thus ultimately injecting more energy into the clock network, and resulting in faster clock rise times or larger clock amplitudes. Moreover, for fixed driver size and duty cycle, operation at a low frequency results in faster clock rise times and larger clock amplitudes than operation at a relatively higher frequency, since the final clock drivers conduct for a longer time, thus again allowing for more current to build up in the inductive elements and the injecting of more energy into the clock network.

In conventional clock distribution networks, drivers are generally sized to yield a target rise time and clock amplitude for the highest frequency at which the clock is operated at. In those designs, the amount of energy injected into the clock network is always the same, regardless of driver size, duty cycle of the reference clock, or operating frequency, assuming that at the peak frequency of the clock drivers are sufficiently large to yield the target clock rise time and clock amplitude. Therefore, rise time and clock amplitude remain largely unchanged at any other clock frequency that is lower than the peak clock frequency. Moreover, the amount of energy injected into the clock network is always the same, regardless of operating frequency.

The distribution of clock signals using resonant clock distribution networks presents particular challenges in the context of digital devices that are specified to operate at multiple clock frequencies. For example, a high-performance microprocessor may be designed to operate at multiple clock frequencies ranging from 100 MHz to 3 GHz. Resonant clock distribution networks are generally designed to achieve their highest energy efficiency when operating in resonant mode, and within a relatively narrow range of clock frequencies that are centered about the natural frequency of the resonant clock network. It is possible for resonant clock networks to operate outside this narrow range, but to maximize energy efficiency, the size of the clock drivers or the duty cycle of the reference clock input to the network needs to be adjusted depending on clock frequency.

Unlike non-resonant clock networks, in which the rise and/or fall time and amplitude of the clock waveform does not depend on the operating frequency, clock rise and/or fall time and amplitude in resonant distribution networks are a function of operating frequency, presenting another challenge in the design of resonant clock distribution networks. In particular, for fixed driver size and reference-clock duty cycle, the amount of energy supplied to the clock network at low clock frequencies is greater than at relatively higher clock frequencies, yielding shorter clock rise times and/or increased clock amplitudes. Therefore, to ensure that clock rise and/or fall times and amplitude meet their specification at every frequency, the size of the clock drivers or the duty cycle of the reference clock in a resonant clock network needs to be adjusted depending on clock frequency.

The use of resonant clock distribution networks is further complicated by the fact that in some circumstances it is desirable to completely disable the inductive elements, essentially using the clock drivers to swing the normally resonant clock distribution network in a "conventional mode". With the inductive elements disabled, however, and therefore unable to provide any driving current to the clock distribution network, at any given clock frequency and with fixed driver size and reference-clock duty cycle, the amount of energy supplied to the clock network in resonant mode differs significantly from amount of energy supplied in conventional mode. As a consequence, to ensure that clock rise and/or fall times and amplitude meet their specification, the size of the clock drivers or the duty cycle of the reference clock in a resonant clock network needs to be adjusted, depending on operating mode.

In addition, since manufacturing variations will affect the actual capacitance of the resonant clock distribution network, the strength of the transistors used to implement the clock drivers, and duty cycle of the actual reference clock signal as it is delivered to the clock drivers, yet further adjustments to the size of the clock drivers or the target duty cycle of the reference clock will be needed, so that the clock signal meets its specification when in actual operation.

At-speed testing presents yet another challenge related with the use of resonant clock distribution networks in digital devices. In this kind of testing, a specific bit pattern is first loaded onto specified scan registers (scan-in mode) using a clock frequency that is significantly slower (for example, 5 times or more) than the target clock frequency that operation is to be tested at. The digital system is then operated for one or more clock cycles at the target clock frequency (at-speed-test mode), and to validate correct function, the contents of the scan registers are then read (scan-out mode) using a clock frequency that is once again significantly slower than the target clock frequency. Resonant clock distribution networks generally require multiple clock cycles of operation before they are able to provide their specified clock amplitude. Therefore, switching from scan-in mode to at-speed-test mode (or from at-speed-test mode to scan-out mode) is a challenge, due to the requirement for full-amplitude clock signals right from the beginning of the at-speed-test mode, and due to the difference in the clock frequencies between the scan modes and the at-speed-test mode. Furthermore, the great difference in clock frequency between scan modes and at-speed-test mode implies a significant difference in the rise and/or fall time of the clock waveform, and generally it is critical that the rise and/or fall times during at-speed testing match that of the resonant clock waveform at the same frequency when the network is operating in resonant mode.

It is possible to address the above challenges in ways that are likely to be impractical for many designs. For example, it is possible to select driver sizes and reference clock duty cycles that meet clock rise time and clock amplitude specifications for the fastest clock frequency at which the device is to be operated, and then use these same driver sizes and duty cycles at all other clock frequencies that may be required. In this case, however, at relatively low clock frequencies, energy consumption will be excessive, and clock amplitude will exceed the nominal voltage specified by the process, resulting in long-term reliability issues. In the context of at-speed test, it is possible to use a high-speed global enable signal to disable the clocked registers on the same clock cycle right after the last bit is scanned in, keep them disabled for as long as it takes for the resonant clock network to yield full-rail clock signals, and enable all clocked registers on the same cycle after the resonant clock signals has reached full rail. However, the design of a network that distributes such a high-speed enable signal with acceptable skew and correct relative timing with respect to the clock requires significant additional engineering effort and physical resources (for example, signal drivers and routing tracks).

Architectures for resonant clock distribution networks without programmable driver sizes or reference clock duty cycles have been described and empirically evaluated in the following articles: "A 225 MHz Resonant Clocked ASIC Chip," by Ziesler C., et al., *International Symposium on Low-Power Electronic Design*, August 2003; "Energy Recovery Clocking Scheme and Flip-Flops for Ultra Low-Energy Applications," by Cooke, M., et al., *International Symposium on Low-Power Electronic Design*, August 2003; and "Resonant Clocking Using Distributed Parasitic Capacitance," by Drake, A., et al., *Journal of Solid-State Circuits*, Vol. 39, No. 9, September 2004. All of these papers are restricted to purely resonant clock distribution networks and make no reference to programmable driver sizes or reference clock duty cycles.

Designs for resonant clock distribution networks with programmable driver sizes and reference clock duty cycles have been described and empirically evaluated in the following articles: "A 1.1 GHz Charge Recovery Logic," by Sathe V., et al., *International Solid-State Circuits Conference*, February 2006; "900 MHz to 1.2 GHz two-phase resonant clock network with programmable driver and loading," by Chueh J.-Y., et al., *IEEE* 2006 *Custom Integrated Circuits Conference*, September 2006; "A 0.8-1.2 GHz frequency tunable single-phase resonant-clocked FIR filter," by Sathe V., et al., *IEEE* 2007 *Custom Integrated Circuits Conference*, September 2007. All of these papers are restricted to resonant clock networks where programmable driver size and reference clock duty cycle have been purposed solely to reduce energy consumption, with no intent to control the rise time or amplitude of the clock waveform.

A resonant clock driver that is also capable of operating in conventional mode has been described in the article "A Resonant Global Clock Distribution for the Cell Broadband Engine Processor," by Chan S., et al., *IEEE Journal of Solid State Circuits*, Vol. 44, No. 1, January 2009. However, the size of the clock drivers and the duty cycle of the reference clock in this article is fixed and therefore, it cannot be programmed depending on clock frequency or operating mode. Moreover, the article makes no reference to programmable clock driver sizes or reference clock duty cycles.

Overall, the examples herein of some prior or related systems and their associated limitations are intended to be illustrative and not exclusive. Other limitations of existing or prior systems will become apparent to those of skill in the art upon reading the following Detailed Description.

SUMMARY OF THE DESCRIPTION

A resonant clock distribution network architecture is described herein that uses clock drivers of programmable size and reference clocks of programmable duty cycle, to achieve a target clock rise time and clock amplitude with low energy consumption when operating in any one of multiple clock frequencies in resonant or non-resonant mode. Such a network is generally applicable to semiconductor devices with various clock frequencies, and high-performance and low-power clocking requirements such as microprocessors, ASICs, and SOCs.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Other advantages and features will become apparent from the following description and claims. It should be understood that the description and specific examples are intended for purposes of illustration only and not intended to limit the scope of the present disclosure.

BRIEF DESCRIPTION OF DRAWINGS

These and other objects, features and characteristics of the present invention will become more apparent to those skilled in the art from a study of the following detailed description in conjunction with the appended claims and drawings, all of which form a part of this specification. In the drawings:

Figure 1:
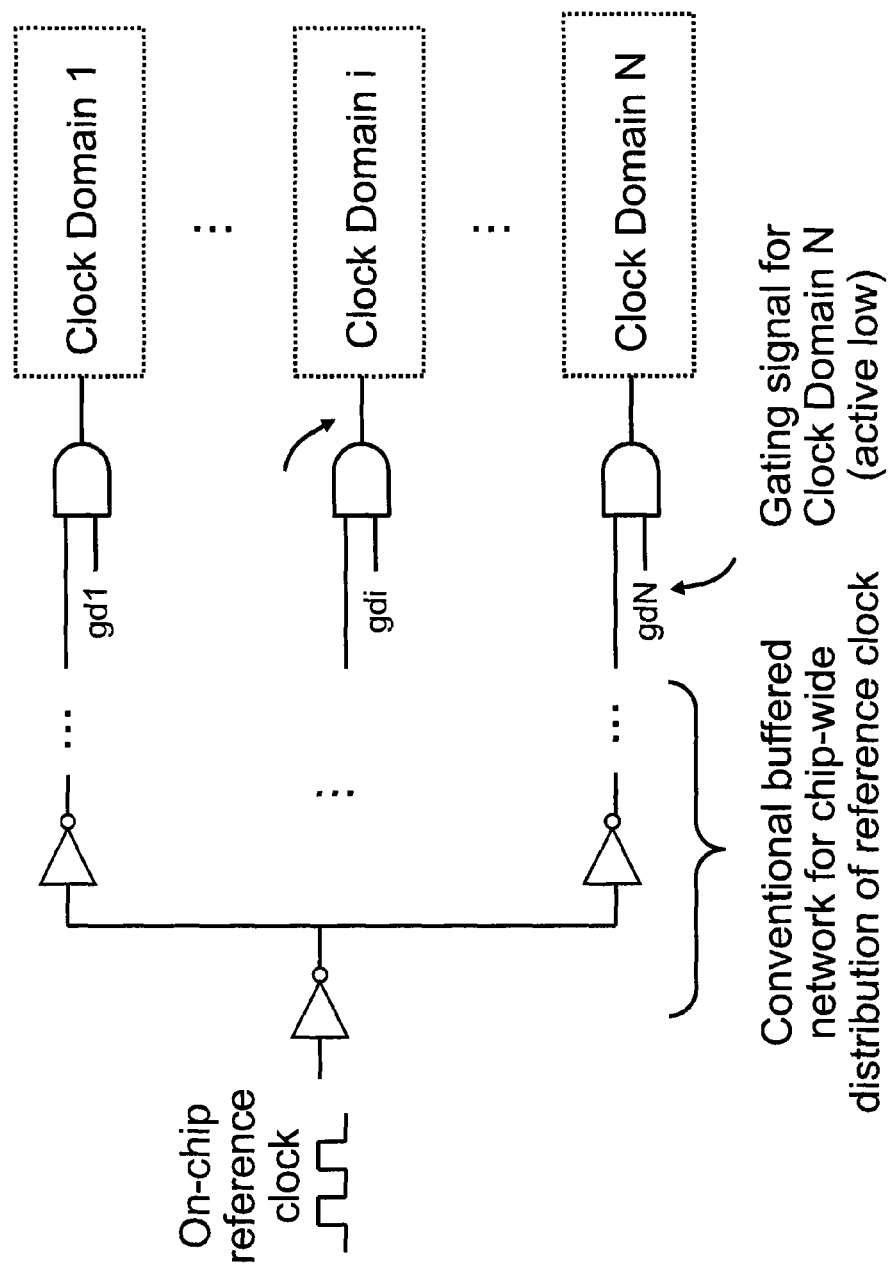
FIG. 1 illustrates an exemplary chip-wide clock distribution network architecture with multiple clock domains.

The headings provided herein are for convenience only and do not necessarily affect the scope or meaning of the claimed invention.

In the drawings, the same reference numbers and any acronyms identify elements or acts with the same or similar structure or functionality for ease of understanding and convenience. To easily identify the discussion of any particular element or act, the most significant digit or digits in a reference number refer to the Figure number in which that element is first introduced (e.g., element 204 is first introduced and discussed with respect to FIG. 2).

DETAILED DESCRIPTION OF THE INVENTION

Various examples of the invention will now be described. The following description provides specific details for a thorough understanding and enabling description of these examples. One skilled in the relevant art will understand, however, that the invention may be practiced without many of these details. Likewise, one skilled in the relevant art will also understand that the invention can include many other obvious features not described in detail herein. Additionally, some well-known structures or functions may not be shown or described in detail below, so as to avoid unnecessarily obscuring the relevant description.

The terminology used below is to be interpreted in its broadest reasonable manner, even though it is being used in conjunction with a detailed description of certain specific examples of the invention. Indeed, certain terms may even be emphasized below; however, any terminology intended to be interpreted in any restricted manner will be overtly and specifically defined as such in this Detailed Description section.

FIG. 1 illustrates a clock distribution network architecture for a semiconductor device. This network comprises multiple clock domains. Each clock domain i receives a reference clock signal. In canonical embodiments, such a reference clock signal has a 50% duty cycle, that is, it attains a high voltage level for 50% of the clock period, and a low voltage level for the remainder 50% of the clock period. For each clock domain i, a gating signal gdi can be used to selectively enable the propagation of the reference clock signal within clock domain i. While FIG. 1 shows a single reference clock, where buffered copies of which are distributed to each of the clock domains, in general, multiple distinct reference clock signals can be propagated to the clock domains, each using a dedicated buffered clock distribution network. Each clock domain receives one of these multiple reference clock signals. These multiple reference clock signals may or may not be synchronized with each other, may be operating at different frequencies, and their frequencies may change over time.

The technique of operating a clock signal at different clock frequencies over time is commonly referred to as frequency scaling and is motivated by the need to reduce power consumption in semiconductor devices. Power consumption in digital semiconductor devices grows in proportion with the rate at which these devices switch between their digital values. When performance requirements decrease, this rate can be reduced by reducing the frequency of the clock signal, thereby reducing power consumption. Generally, semiconductor devices have a wide range of operating frequencies. For example, microprocessors may be designed to achieve a peak clock frequency of 3 GHz, while also supporting operation at 1 GHz or 500 MHz.

Figure 2:
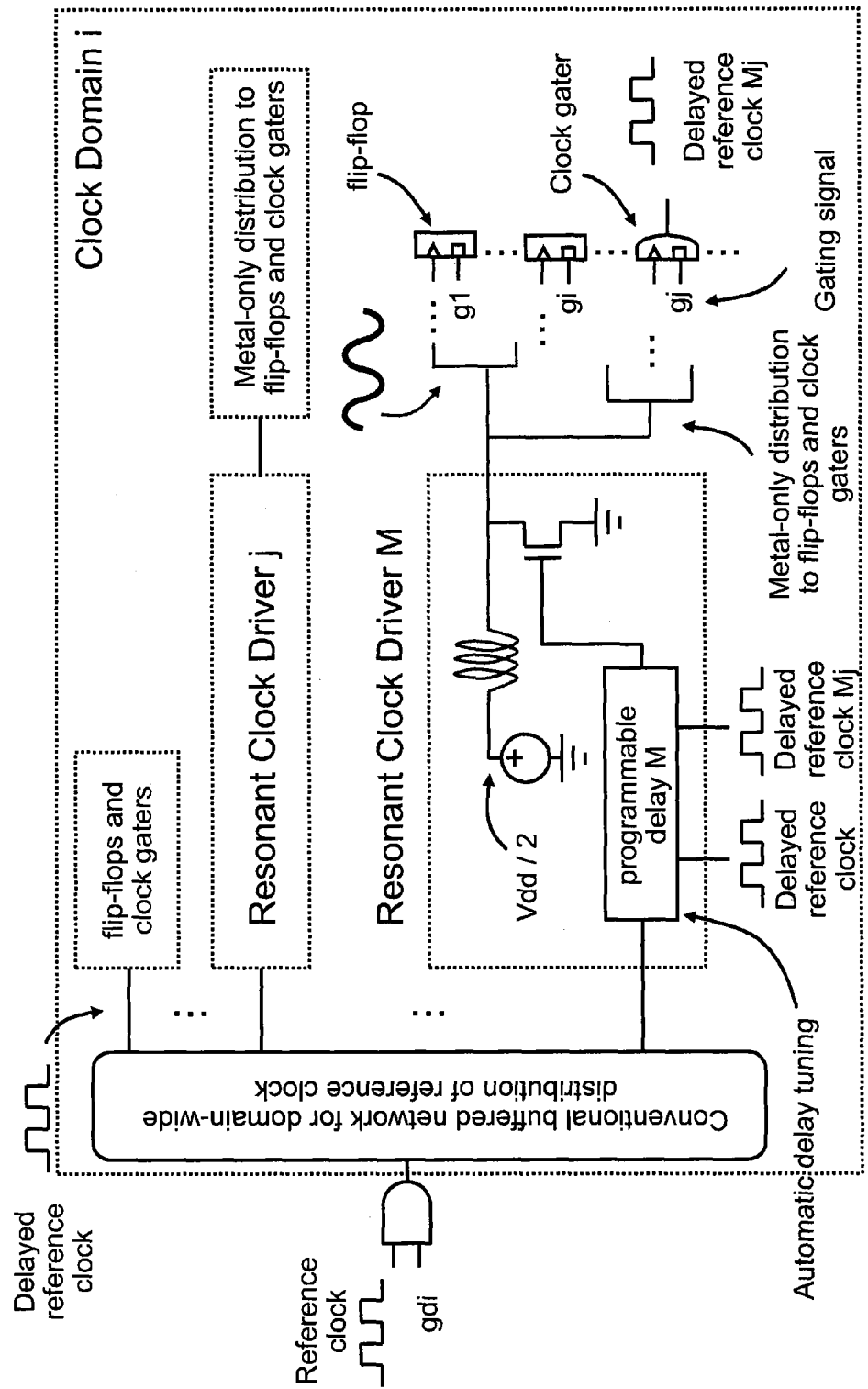
FIG. 2 illustrates an exemplary clock distribution network architecture within a clock domain.

FIG. 2 shows an exemplary clock distribution network architecture within a clock domain, that incorporates resonant clock drivers. Using a buffered distribution network, the reference clock is distributed to multiple clocked devices such as flip-flops and clock gaters. The flip-flops are storage elements that update their contents according to their data inputs and in synch with their clock inputs. Each clock gater g uses a gating signal gi to selectively enable the further propagation of the clock signal to other clocked elements. In a resonant clock distribution network architecture, one or more buffers are each augmented by an inductor that is used to provide additional drive strength with low energy consumption, by resonating the parasitic capacitance of the load seen by the driver. The resulting combination of the buffer, inductor, and other ancillary circuitry is generally referred to as a resonant clock driver.

A canonical resonant clock driver design is also shown in FIG. 2. This driver comprises a pull-down NMOS device whose drain is connected to the clock node and whose source is connected to the ground terminal. The gate of this NMOS device is driven by the reference clock signal. The arrival time of this reference clock signal to the gate of the NMOS device may be adjusted by a programmable delay element, so that certain skew requirements are met at the final arrival points of the clock signal. An inductor is connected between the clock node and a supply node whose voltage is centered at approximately the mid-point of the clock signal oscillation. For example, if the clock signal oscillates between 0V and 1V, the mid-point supply level is approximately 0.5V. To maximize energy savings, the value of the inductor is approximately chosen so that the LC tank set up by the inductor and the parasitic capacitance of the clock has a natural frequency that is approximately equal to the frequency of the reference clock signal.

The energy efficiency of a resonant clock network depends on various design and operating parameters, including the overall resistance in the clock distribution network and the mismatch between the natural frequency of the clock network and the frequency of the reference clock signal. In general, energy efficiency decreases as the resistance R of the clock distribution network increases, due to the $I^2R$ losses associated with the flow of the current I that charges and discharges the parasitic clock load through the resistance R. Also, as the frequency of the reference clock that drives the resonant driver moves further away from the natural frequency of the resonant clock driver, energy efficiency decreases. When the mismatch between the two frequencies becomes too large, the energy consumption of the resonant clock driver becomes excessive and impractically high. Moreover, the shape of the clock waveform becomes so distorted that it cannot be reliably used to clock flip-flops or other clocked storage elements. Consequently, resonant clock drivers tend to have a narrower range of clock frequencies at which they operate efficiently in resonant mode, compared to the range of clock frequencies generally supported by a semiconductor device that uses frequency scaling. In practice, to support the broad range of operating frequencies that are sometimes used in a frequency-scaled semiconductor device, the resonant driver may need to be modified to allow disabling of the inductor so that it can be operated in conventional mode when the reference clock frequency is significantly different from the natural frequencies it supports.

Figure 3:
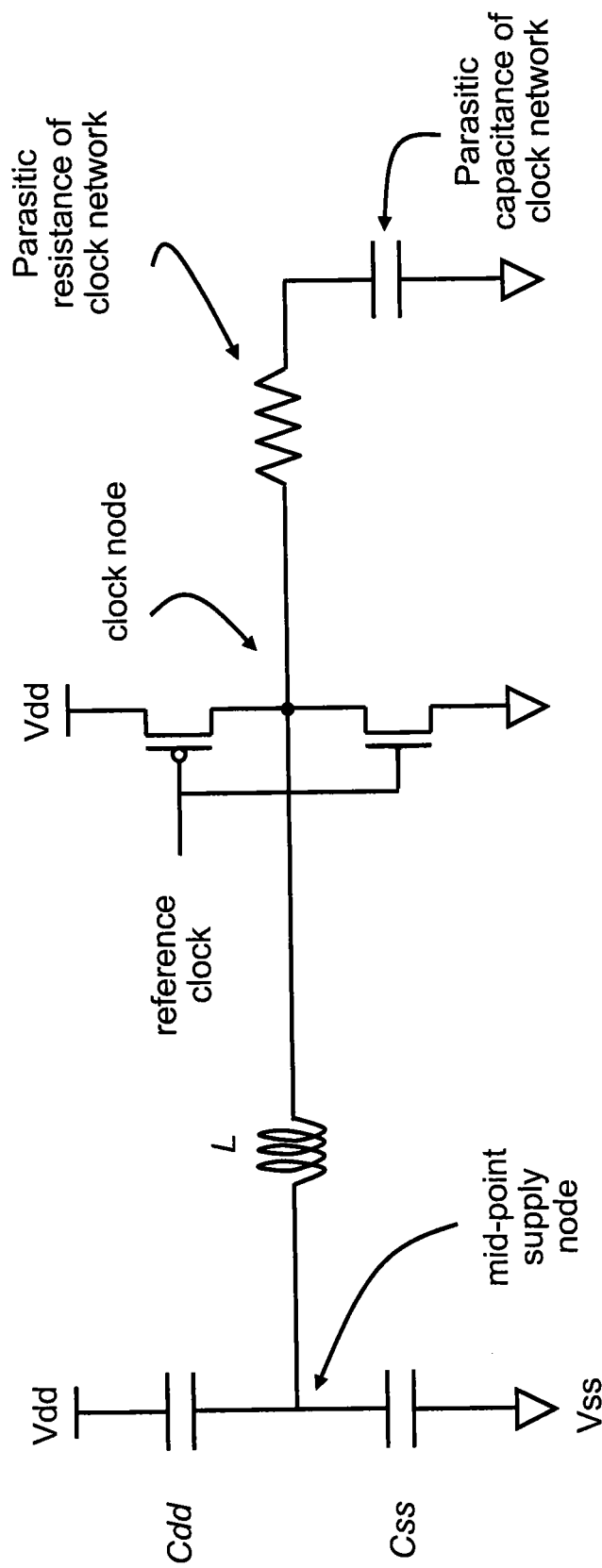
FIG. 3 illustrates an exemplary resonant clock driver design with fixed-size drivers.

FIG. 3 shows an exemplary resonant clock driver design. This driver comprises both a pull-up PMOS and a pull-down NMOS device for driving the clock. The PMOS device is connected between the clock node and the power supply terminal. The NMOS device is connected between the clock node and the ground terminal. An inductor L is connected between the clock node and a mid-point supply node. Instead of relying on a separate power supply to provide the mid-point supply level, an undesirable and often prohibitive requirement in practice, in this driver the mid-point supply is implemented using two capacitors Cdd and Css. Capacitor Cdd is connected between the mid-point node and the power supply terminal. Capacitor Css is connected between the mid-point node and the ground terminal. In this design, the mid-point supply is charged gradually, within a number of cycles of driver operation, that is determined by the values of the capacitors Cdd and Css, the sizes of the NMOS and PMOS devices, and a variety of other component and electrical parameters. During these cycles, the amplitude of the clock signal gradually increases towards its full-rail value. In general, the number of cycles that it takes to charge the mid-point supply and reach full-rail clock amplitude is inversely proportional to the size of the resonant clock driver.

The resonant clock driver shown in FIG. 3 demonstrates how the clock signal generated by a resonant clock driver generally requires a number of cycles to reach full-rail amplitude, thereby making the performance of at-speed testing with such a driver a challenging task. In particular, if the resonant clock driver is used to provide the scan clock and the at-speed clock, which is sometimes the case in practice, then switching between the relatively low frequency of scan in/out (for example, 500 MHz) and the relatively high at-speed operating frequency (for example, 3 GHz) with no idle cycles in between would require an impractically large resonant driver, requiring excessive currents during scan and at-speed operation, and yielding clock waveforms that are un-characteristic of clock waveforms during normal operation. Another alternative would be the design of a high-speed network for propagating an enable signal to selectively enable flip-flops only when clock amplitude and clock frequency have stabilized. Such a solution presents several drawbacks, however, including the device and routing overheads of such a network, the requirement for including an enable port with all flip-flops, and the requirement for the enable signal to satisfy stringent timing constraints with respect to the resonant clock waveform.

Figure 4:
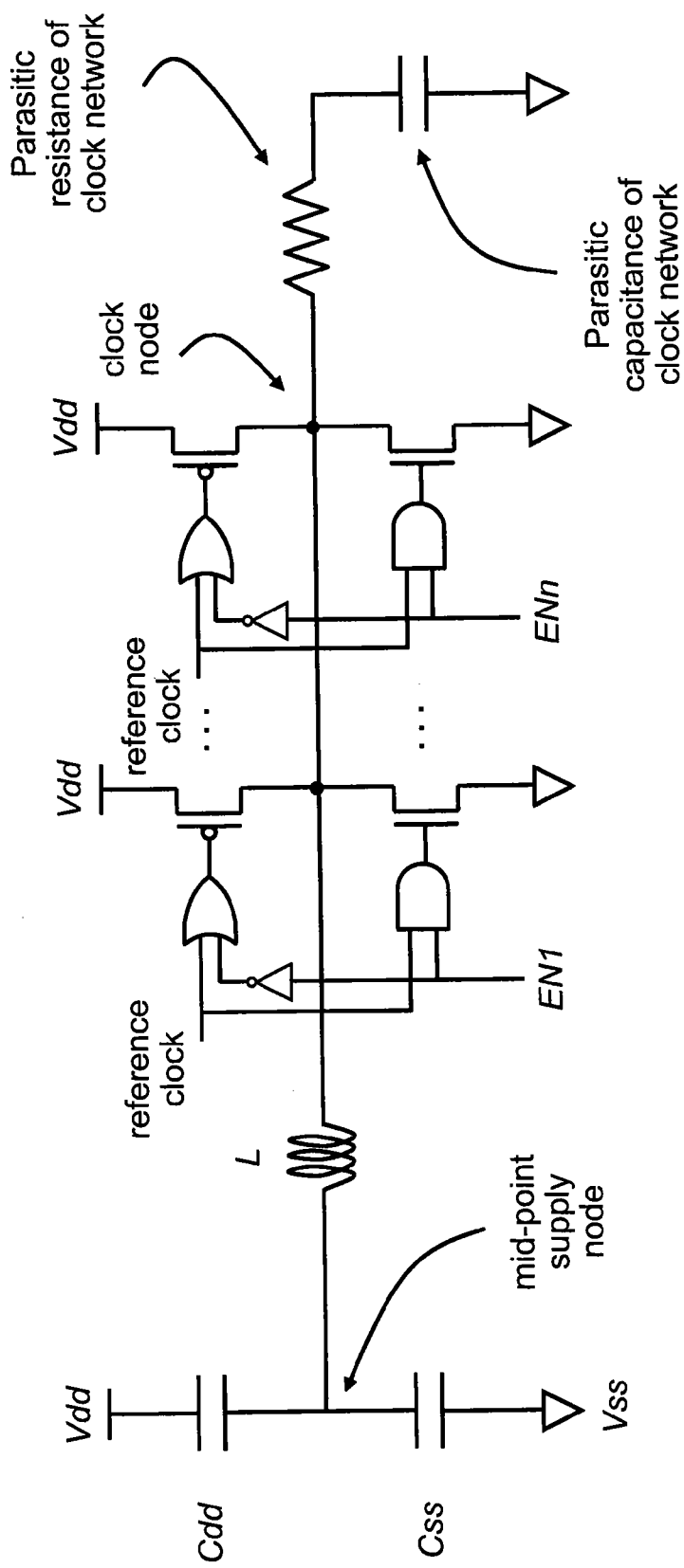
FIG. 4 illustrates an exemplary resonant clock driver design with programmable driver sizes.

FIG. 4 shows an exemplary resonant clock driver design with programmable drivers. This driver includes control signals EN1, . . . ENn for selectively enabling pull-up PMOS and pull-down NMOS devices, thus allowing the programming of driver size. Such a programmable driver design was described in "A 1.1 GHz Charge Recovery Logic," by Sathe V., et al., *International Solid-State Circuits Conference*, February 2006; "900 MHz to 1.2 GHz two-phase resonant clock network with programmable driver and loading," by Chueh J.-Y., et al., *IEEE* 2006 *Custom Integrated Circuits Conference*, September 2006; "A 0.8-1.2 GHz frequency tunable single-phase resonant-clocked FIR filter," by Sathe V., et al., *IEEE* 2007 *Custom Integrated Circuits Conference*, September 2007. This programmable driver design was introduced in the context of minimizing overall power consumption in the resonant clock driver by adjusting the size of the driver and the duty cycle of the reference clock. However, driver size and reference clock duty cycle programmability have not been introduced or investigated in the context of achieving a target clock rise time or clock amplitude at various clock frequencies. Moreover, this driver is not capable of operating in conventional mode.

Figure 5:
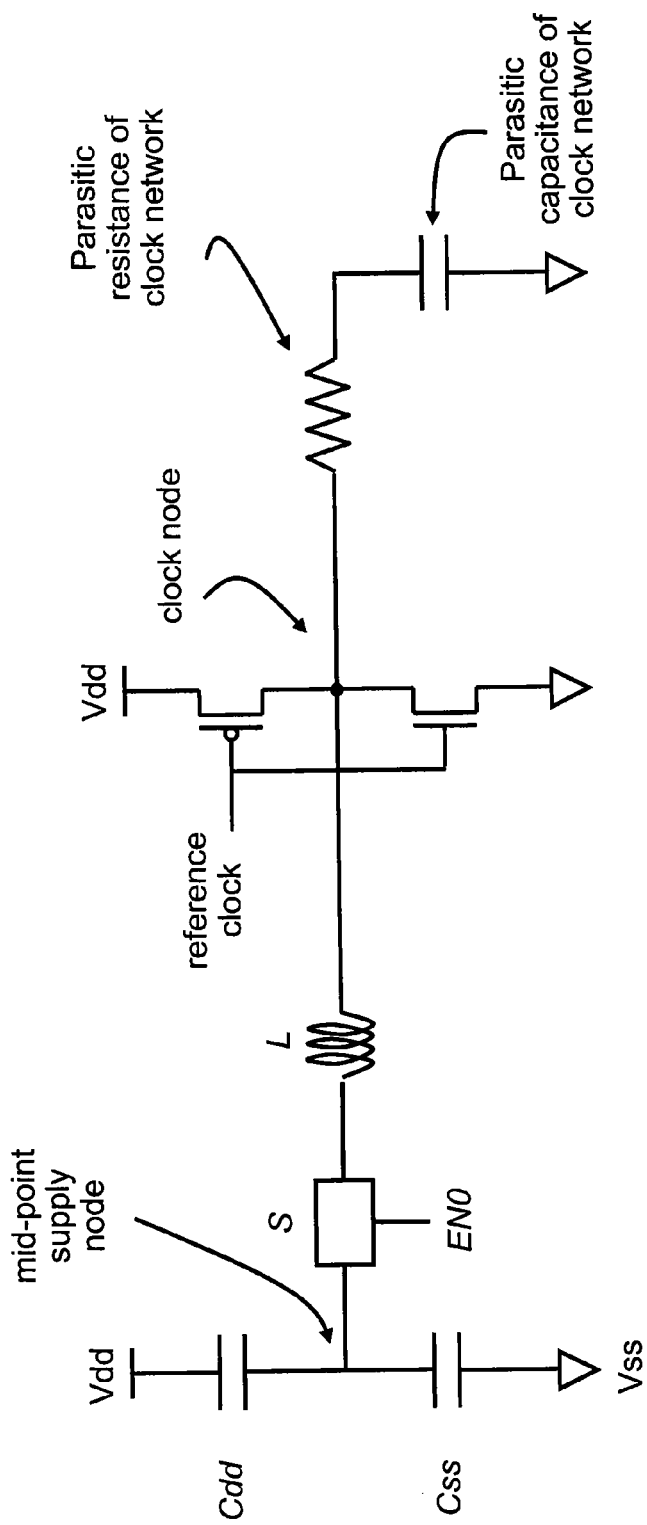
FIG. 5 illustrates an exemplary resonant clock driver design with fixed-size drivers, which is also capable of operating in non-resonant mode.

FIG. 5 shows an exemplary resonant clock driver of fixed size that is also capable of operating in conventional mode. Such a driver has been described in the article "A Resonant Global Clock Distribution for the Cell Broadband Engine Processor," by Chan S., et al., *IEEE Journal of Solid State Circuits*, Vol. 44, No. 1, January 2009. In this driver, a signal EN0 is used to control a switch S between the mid-point supply and the inductor. This switch can be implemented in a variety of ways (for example, as a transmission gate) and is introduced to allow operation in conventional mode far from resonance (for example, during test). When the switch is conducting, the driver operates in resonant mode; when the switch is turned off, the mid-point supply is decoupled from the inductor, and the driver operates in conventional mode. This article does not propose or describe the use of programmable drivers or programmable reference clock duty cycle.

Figure 6A:
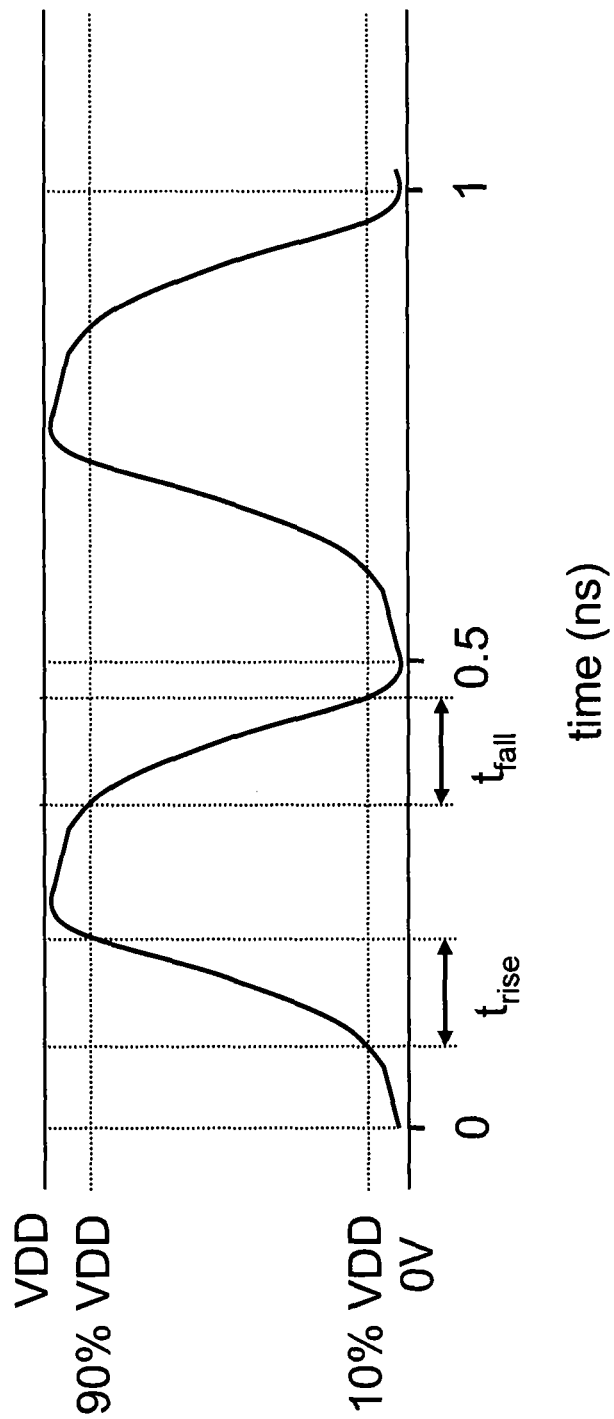
FIG. 6 illustrates the impact of increasing driver size or reference clock duty cycle on the rise time of a resonant clock waveform at a given frequency.
Figure 6B:
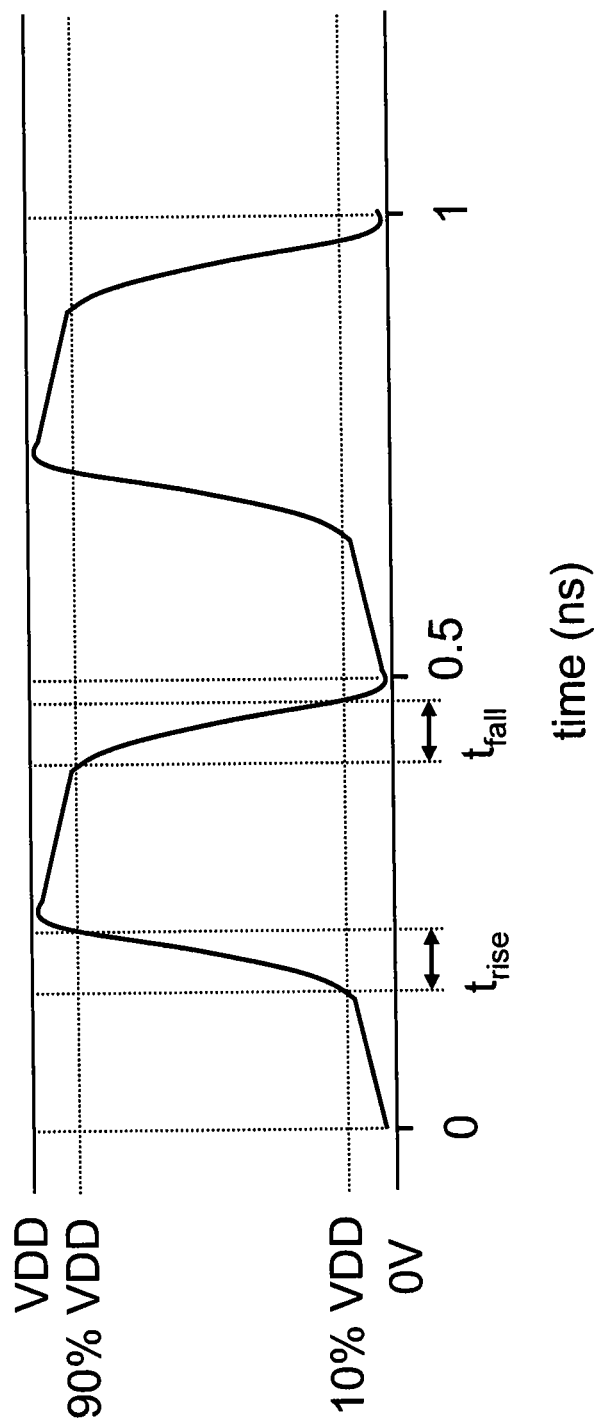

FIG. 6 shows the impact of adjusting driver size or reference clock duty cycle on the rise time of a resonant clock waveform. FIG. 6(a) shows a resonant clock waveform with a frequency of 2 GHz that is obtained with a given driver size. FIG. 6(b) shows the resonant clock waveform that has been obtained at the same clock frequency of 2 GHz by increasing the size of the clock driver or the duty cycle of the reference clock. Such an increase results in a shorter clock rise time and clock fall time.

Figure 7A:
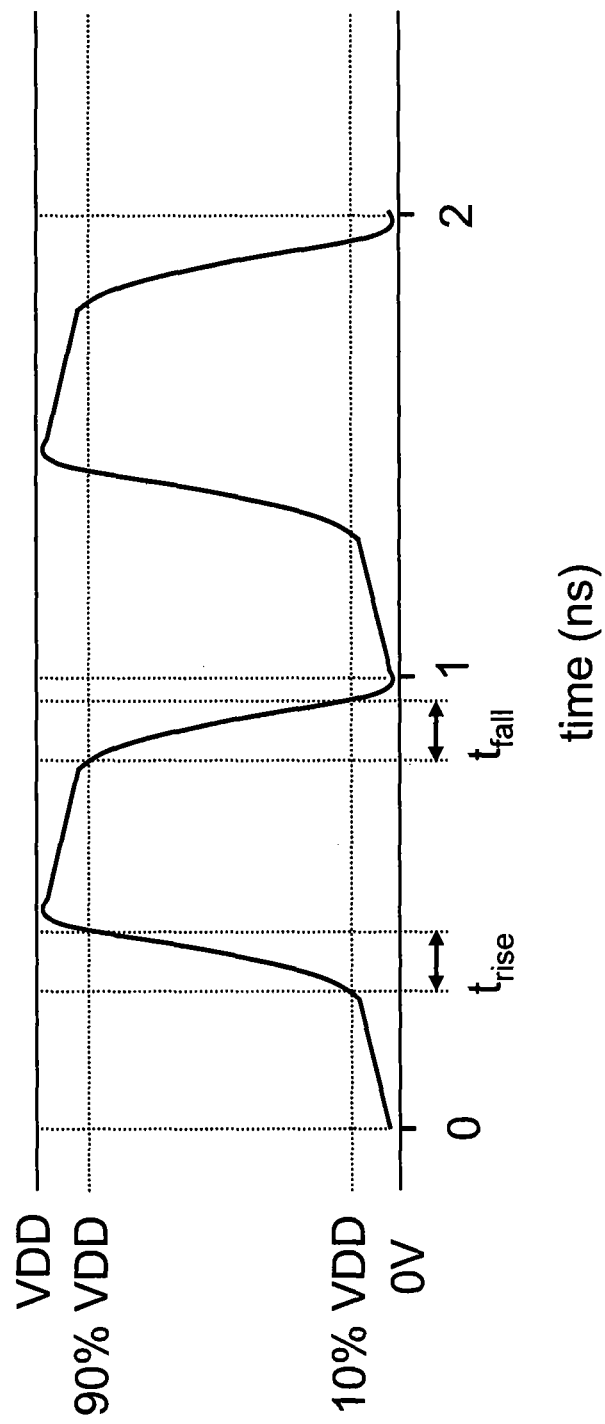
FIG. 7 illustrates the impact of adjusting driver size or reference clock duty cycle on the rise time and clock amplitude of a resonant clock waveform at two different frequencies.
Figure 7B:
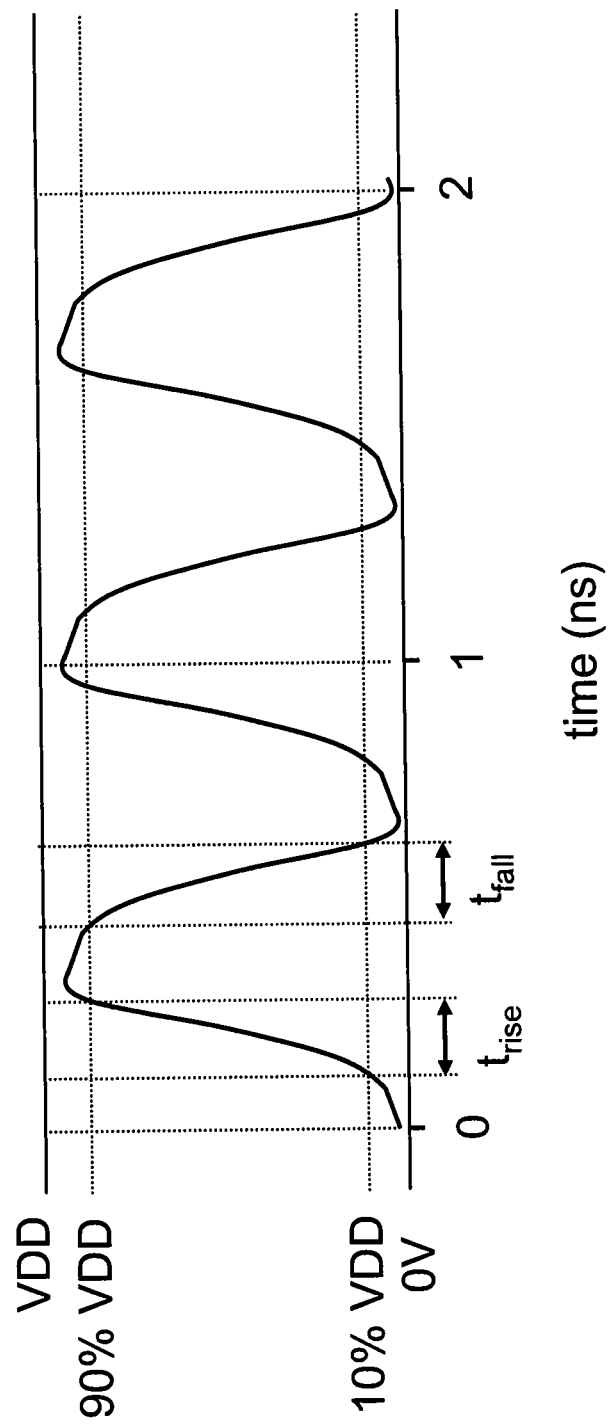
Figure 7C:
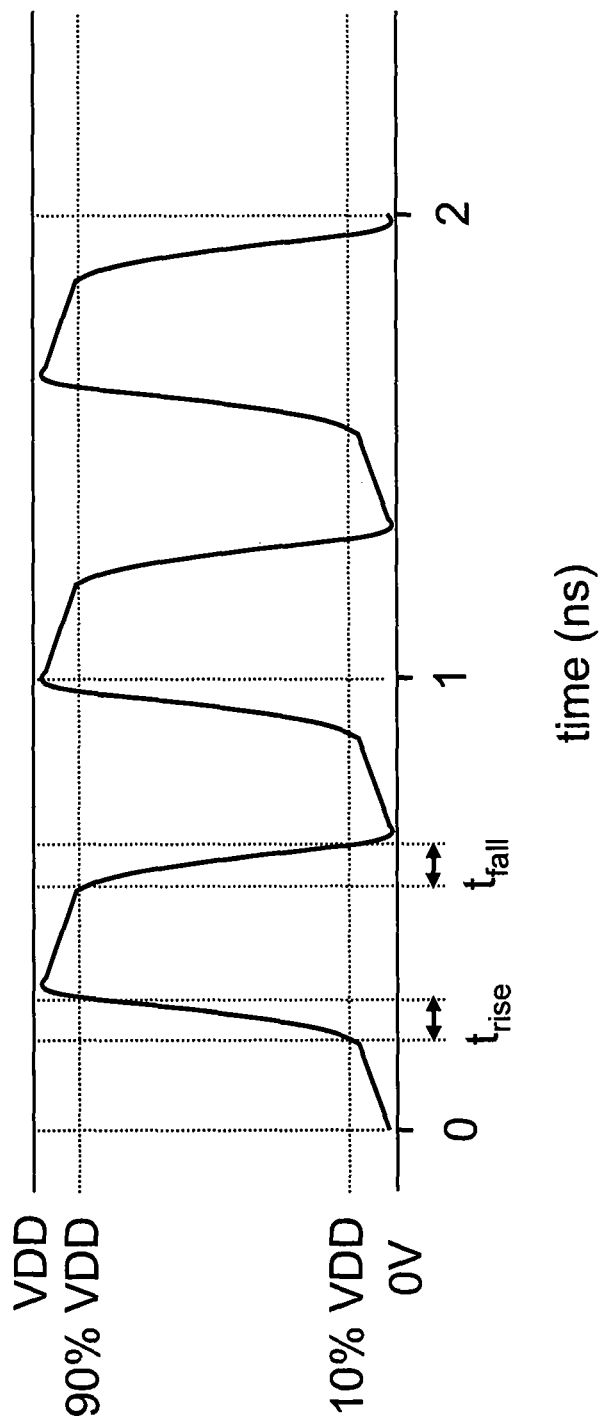

FIG. 7 shows the impact of adjusting driver size or reference clock duty cycle on the clock waveform when the clock is operating at different frequencies. FIG. 7(a) shows a resonant clock waveform at a frequency of 1 GHz which has been obtained with a given driver size. FIG. 7(b) shows the resonant clock waveform obtained when the same driver size is used with the same clock load at 1.5 GHz. Notice that the 1.5 GHz clock waveform has a longer rise time than the 1 GHz one, since the replenishing time has decreased due to the increase clock frequency. Moreover, notice that the peak amplitude of the clock waveform does not reach all the way to the power supply voltage level VDD. FIG. 7(c) shows the resonant clock waveform obtained after increasing the size of the driver or the reference clock duty cycle to inject additional energy into the clock network. This waveform reaches a peak voltage of VDD and achieves a shorter rise time and a shorter fall time than the waveform with the smaller driver or shorter reference clock duct cycle.

Figure 8:
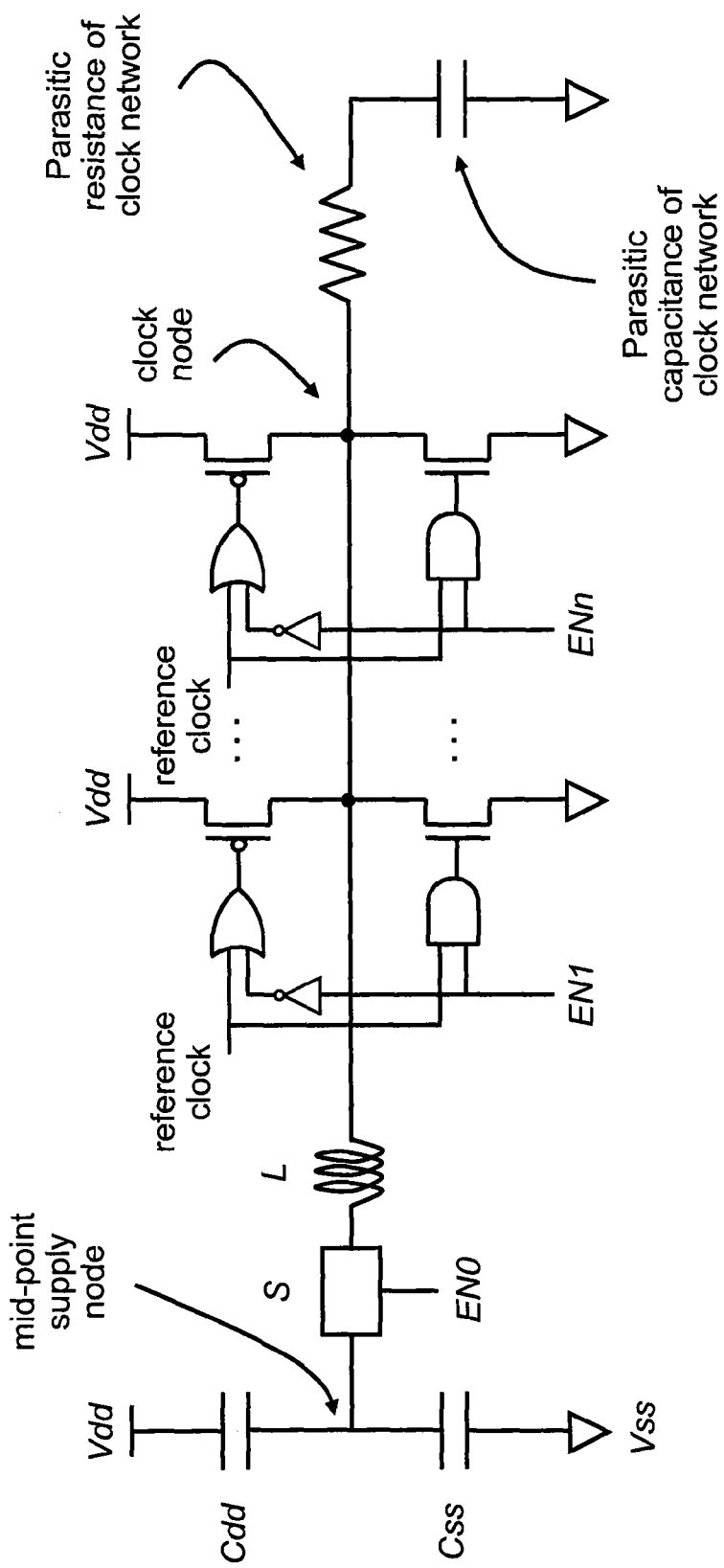
FIG. 8 illustrates an exemplary embodiment of a programmable driver, which is also capable of operating in non-resonant mode.

An embodiment of the programmable driver for resonant clock distribution networks is shown in FIG. 8. This driver includes control signals EN1, ..., ENn to selectively enable NMOS pull-down and PMOS pull-up devices, thus allowing the programming of driver size. It should be noted that the terms "driver size" and "drive strength," as referred to herein, refer to the overall drive strength contributed by a set of drivers (or drive elements) that are enabled at a given instant. It also includes control signal EN0 to selectively enable a switch S, thus setting the operation of the clock distribution in resonant or non-resonant mode. When operating in resonant mode, only a subset of the devices need to be enabled, since the inductor provides the additional drive strength required to achieve full-rail clock amplitude and target clock rise times. In general, driver size is a function of clock frequency, with larger drivers generally being required for higher clock frequencies. Such a programmable configuration results in lower energy consumption than a fixed-size configuration in which all devices are always enabled, since the smaller number of devices results in smaller currents from the supply to the ground, and in smaller capacitive load in the pre-driver circuitry. In embodiments, however, a programmable driver is used to control the rise and/or fall time and clock amplitude at each clock frequency, and operating mode.

When the driver shown in FIG. 8 operates in conventional mode, a larger subset of devices is enabled than in resonant mode at the natural frequency of the resonant clock network, as required by target clock rise times, since in this mode the inductor is decoupled and does not provide any additional drive strength.

During at-speed testing, the described programmable driver operates in conventional mode. The number of enabled devices is selected so that the resulting clock waveforms yield comparable flip-flop delays (that is, time required for data to propagate from the input to the output of the flip-flop after the rising edge of the clock) as the at-speed resonant clock waveforms.

Figure 9:
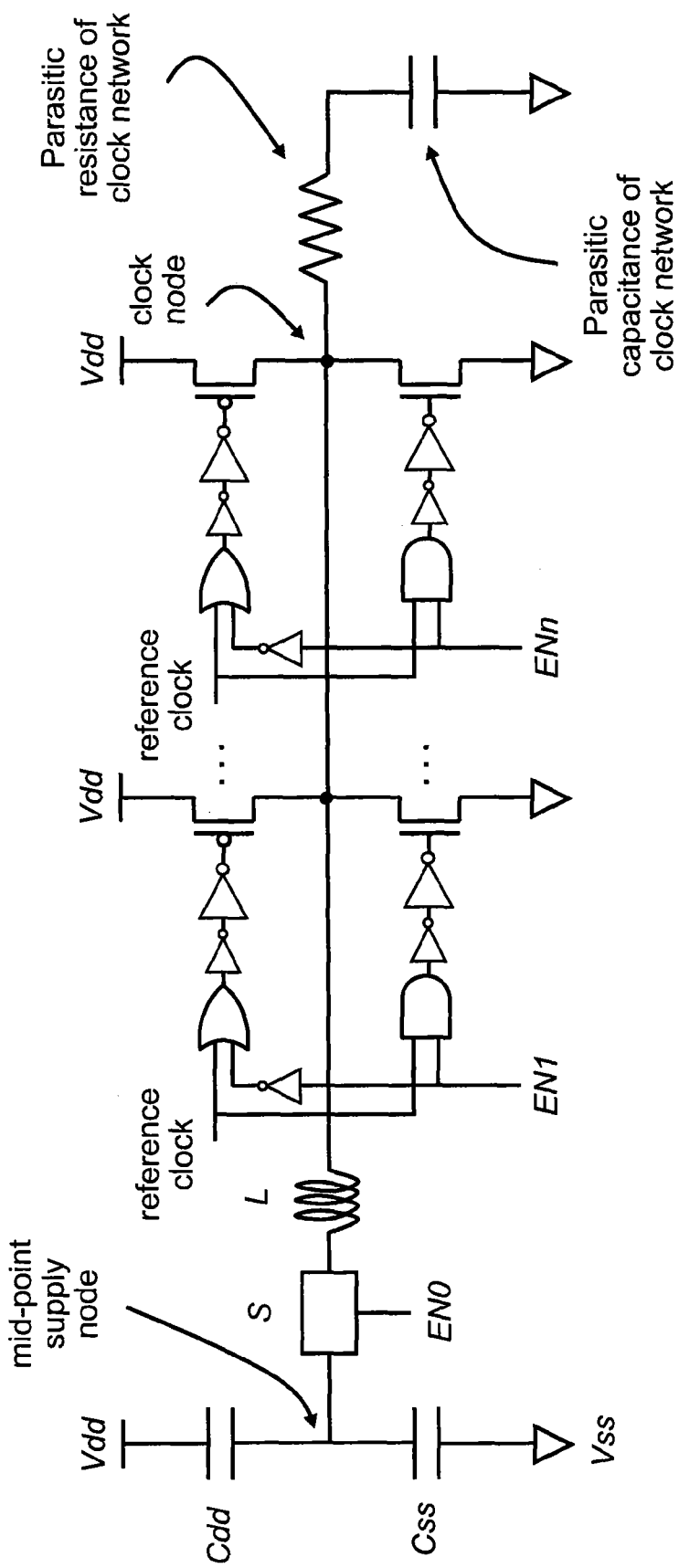
FIG. 9 illustrates an exemplary embodiment of a programmable driver, which is also capable of operating in non-resonant mode.

FIG. 9 shows an alternative embodiment of the described programmable driver, in which the control signals EN1, ..., ENn are introduced in the pre-driver circuitry, resulting in additional power savings compared to their introduction right before the final clock drivers.

Figure 10:
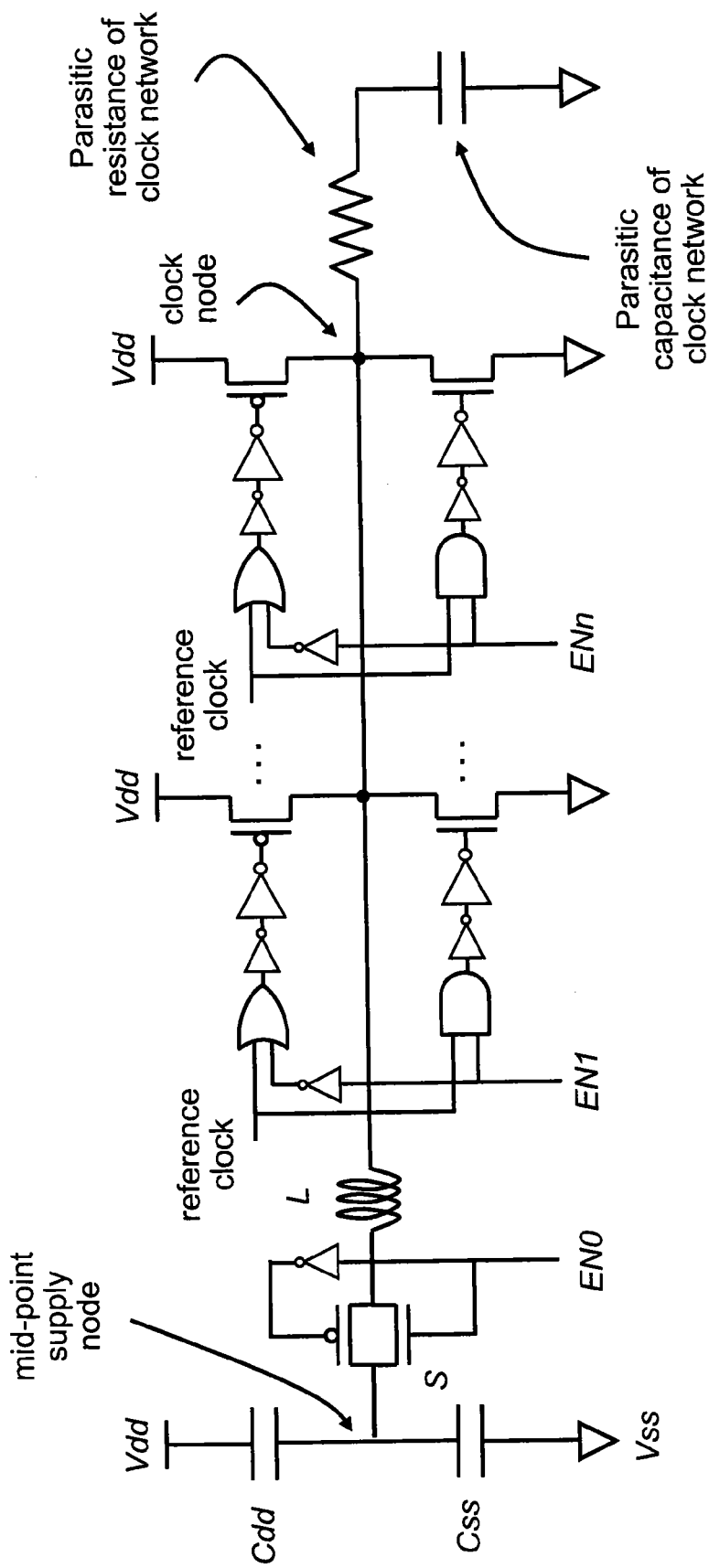
FIG. 10 illustrates an exemplary embodiment of a programmable driver, which is also capable of operating in non-resonant mode.

FIG. 10 shows another embodiment of a programmable driver, in which the switch S is a transmission gate with both NMOS and PMOS devices connected between the inductor and the mid-point supply.

Figure 11:
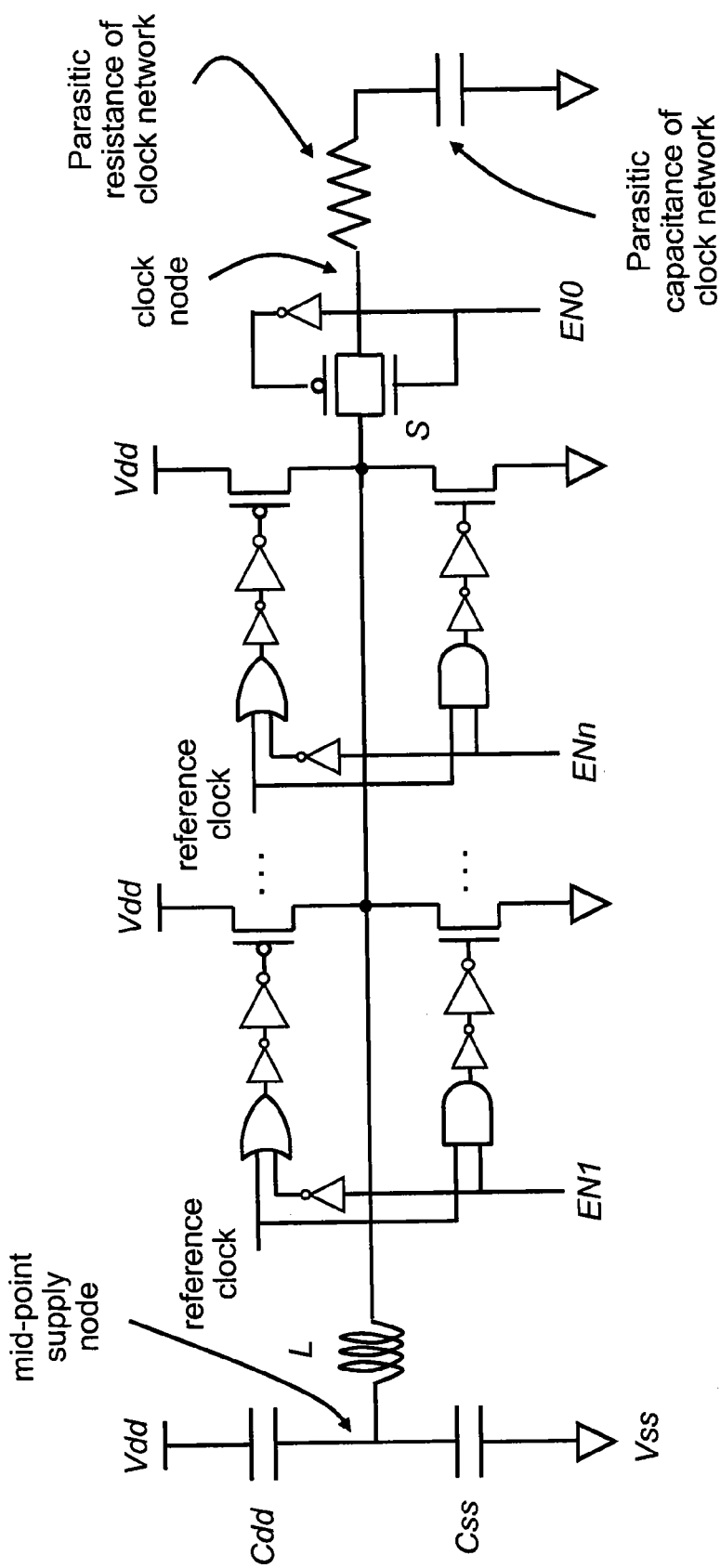
FIG. 11 illustrates an exemplary embodiment of a programmable driver, which is also capable of operating in non-resonant mode.

Another embodiment of the programmable driver is shown in FIG. 11. In this embodiment, the switch S is a transmission gate with both NMOS and PMOS devices connected between the inductor and the clock node.

Figure 12:
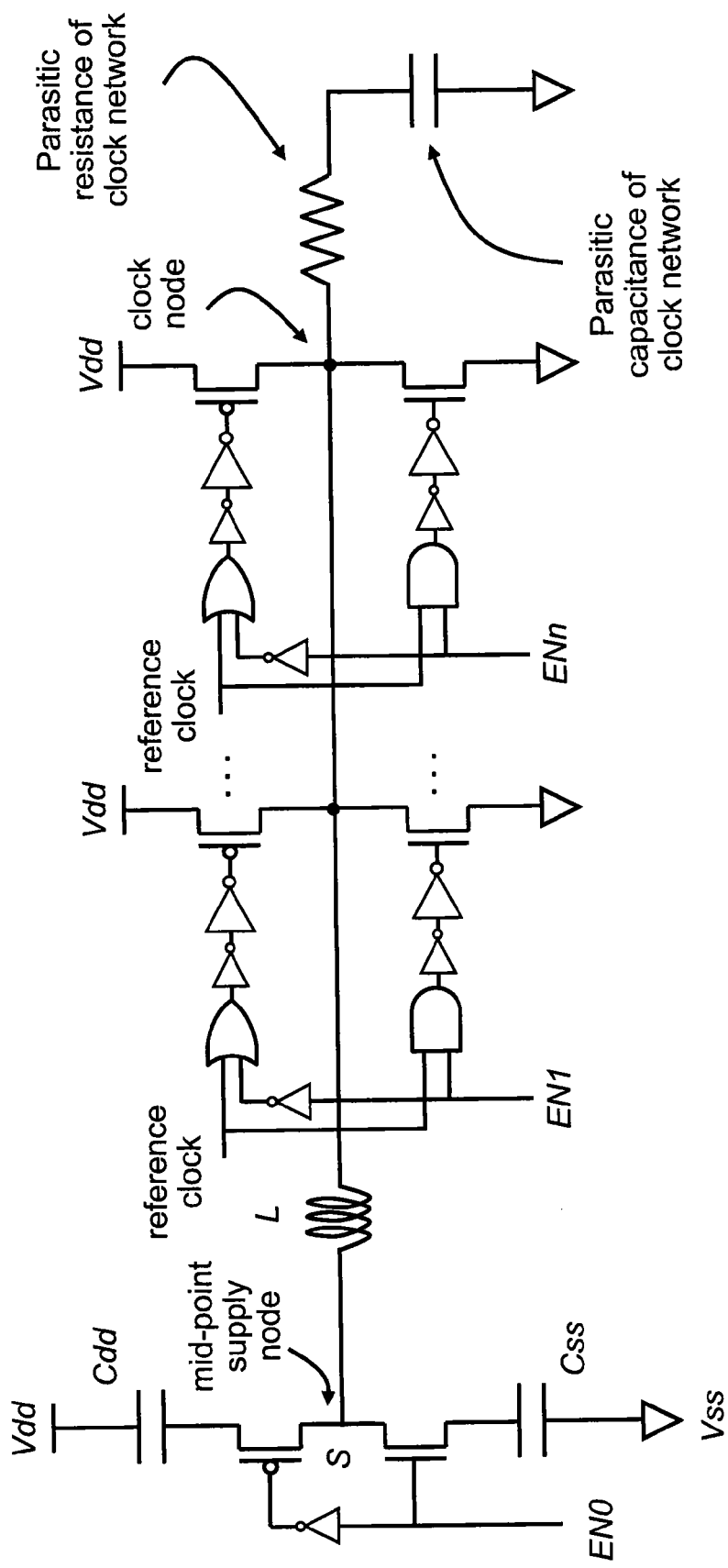
FIG. 12 illustrates an exemplary embodiment of a programmable driver, which is also capable of operating in non-resonant mode.

FIG. 12 illustrates another embodiment of the programmable driver. In this embodiment, the switch S is implemented as a PMOS device connected between the power rail and the mid-point supply node, and an NMOS device connected between the mid-point supply node and the ground rail.

Figure 13:
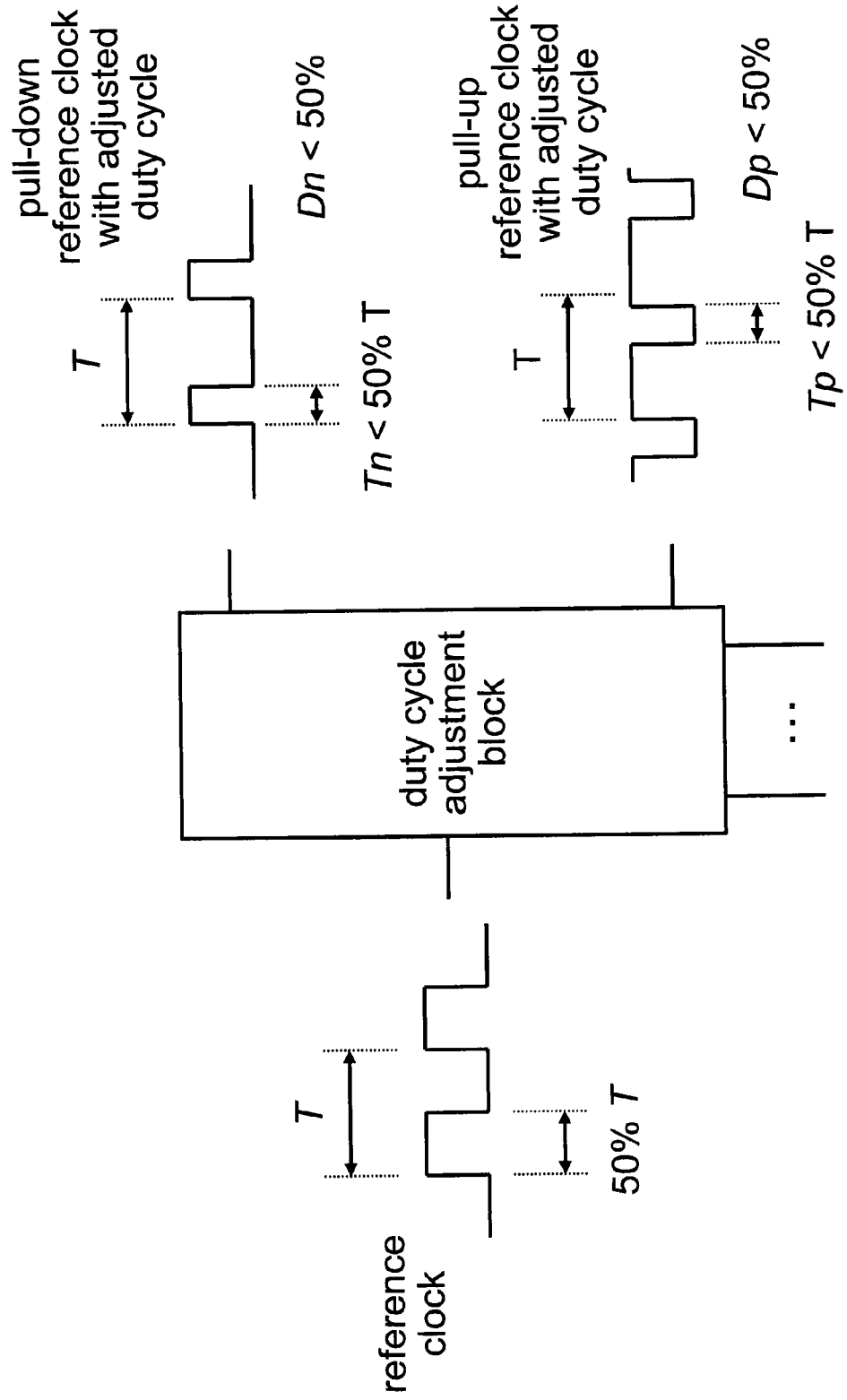
FIG. 13 illustrates an exemplary embodiment of an approach for generating reference clock signals with modified duty cycles.

FIG. 13 illustrates an embodiment for another aspect of the approach described herein. In this embodiment, the reference clock signal is modified to derive two reference clock signals with adjusted duty cycles, one for the pull-up devices and one for the pull-down devices of a resonant clock driver. Generally, the reference clock has a duty cycle equal to 50%. In general, the reference clock may have an arbitrary duty cycle. The duty cycles Dn and Dp of the two derivative reference clocks are determined so that the amount of energy injected into the resonant clock network each clock cycle is sufficient to meet a target clock rise time or clock amplitude. In this figure, both Dn (time at high level divided by clock period) and Dp (time at low level divided by clock period) are less than 50%. The programmable duty cycle adjustment box generates the two reference clocks with adjusted duty cycles Dn and Dp in accordance with the values of the control bits DC1, ..., DCm.

Figure 14:
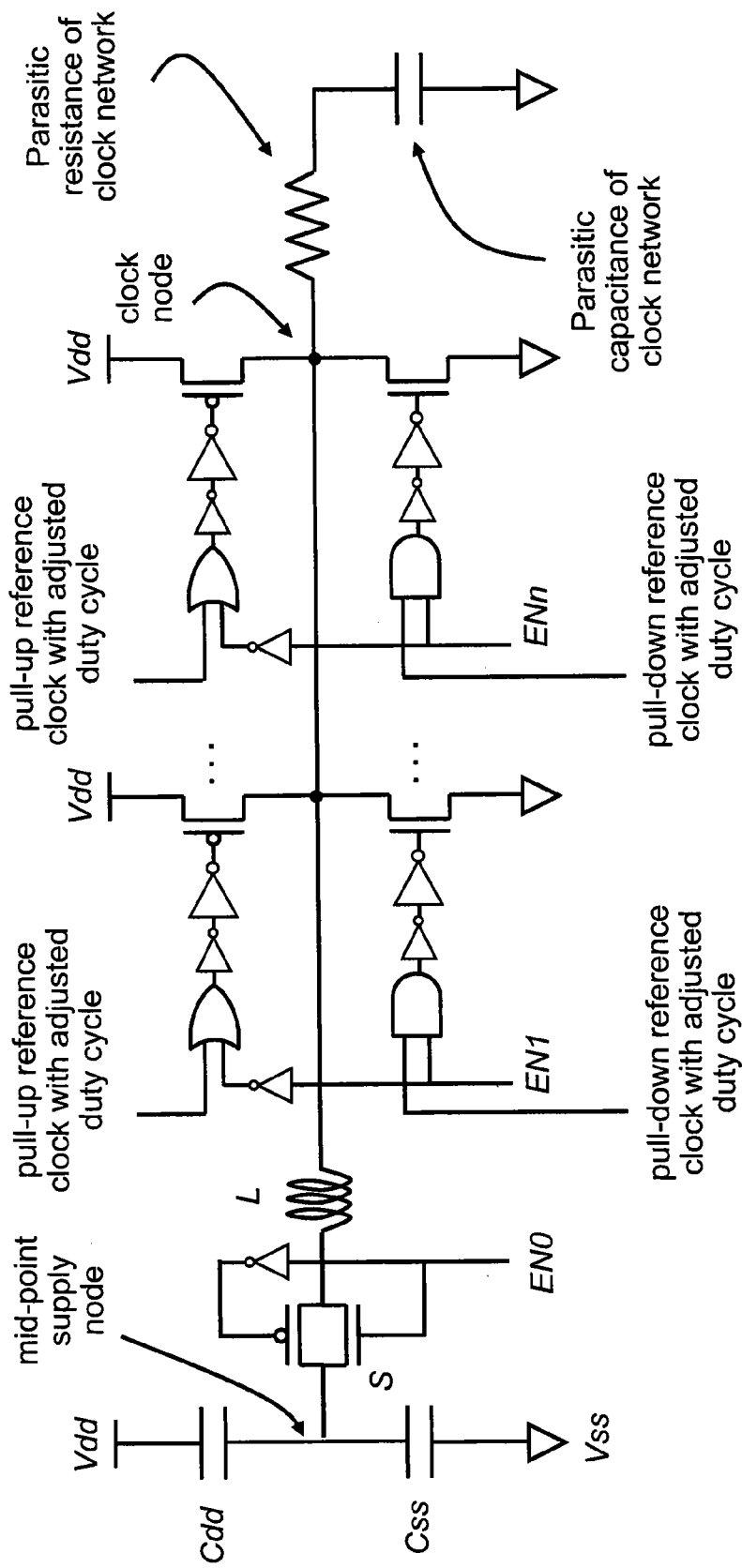
FIG. 14 shows an embodiment of an exemplary programmable driver that is also capable of operating with programmable reference clock duty cycles and in non-resonant mode.

FIG. 14 illustrates an embodiment of a resonant clock driver that can be used to control the rise time and amplitude of a resonant clock waveform. In this embodiment, the size of the final driver can be programmed using control signals EN1, ..., ENn. Furthermore, in this embodiment the pull-up and pull-down devices can be driven by respective reference clocks with programmable duty cycles Dp and Dn, respectively. The switch S determines the operating mode of the driver, resonant or non-resonant, by selectively decoupling the inductor from the mid-point supply based on the value of the control signal EN0. The switch S can be placed in alternative locations to derive alternative embodiments similar to the ones shown in FIG. 11 and FIG. 12.

During at-speed testing, the proposed programmable driver of FIG. 14 operates in non-resonant mode. The number of enabled devices is selected so that the resulting non-resonant clock waveforms yield comparable flip-flop delays (that is, time required for data to propagate from the input to the output of the flip-flop after the rising edge of the clock) as the at-speed resonant clock waveforms.

Unless the context clearly requires otherwise, throughout the description and the claims, the words "comprise," "comprising," and the like are to be construed in an inclusive sense (i.e., to say, in the sense of "including, but not limited to"), as opposed to an exclusive or exhaustive sense. As used herein, the terms "connected," "coupled," or any variant thereof means any connection or coupling, either direct or indirect, between two or more elements. Such a coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the invention is not intended to be exhaustive or to limit the invention to the precise form disclosed above. While specific examples for the invention are described above for illustrative purposes, various equivalent modifications are possible within the scope of the invention, as those skilled in the relevant art will recognize. While processes or blocks are presented in a given order in this application, alternative implementations may perform routines having steps performed in a different order, or employ systems having blocks in a different order. Some processes or blocks may be deleted, moved, added, subdivided, combined, and/or modified to provide alternative or sub-combinations. Also, while processes or blocks are at times shown as being performed in series, these processes or blocks may instead be performed or implemented in parallel, or may be performed at different times. Further any specific numbers noted herein are only examples. It is understood that alternative implementations may employ differing values or ranges.

The various illustrations and teachings provided herein can also be applied to systems other than the system described above. The elements and acts of the various examples described above can be combined to provide further implementations of the invention.

Any patents and applications and other references noted above, including any that may be listed in accompanying filing papers, are incorporated herein by reference. Aspects of the invention can be modified, if necessary, to employ the systems, functions, and concepts included in such references to provide further implementations of the invention.

These and other changes can be made to the invention in light of the above Detailed Description. While the above description describes certain examples of the invention, and describes the best mode contemplated, no matter how detailed the above appears in text, the invention can be practiced in many ways. Details of the system may vary considerably in its specific implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

While certain aspects of the invention are presented below in certain claim forms, the applicant contemplates the various aspects of the invention in any number of claim forms. For example, while only one aspect of the invention is recited as a means-plus-function claim under 35 U.S.C. §112, sixth paragraph, other aspects may likewise be embodied as a means-plus-function claim, or in other forms, such as being embodied in a computer-readable medium. (Any claims intended to be treated under 35 U.S.C. §112, ¶6 will begin with the words "means for.") Accordingly, the applicant reserves the right to add additional claims after filing the application to pursue such additional claim forms for other aspects of the invention.

We claim:

1. A resonant clock driver for a clock distribution network, comprising:
    a plurality of drive elements electrically coupled to a clock node of the resonant clock driver, each of the plurality of drive elements configured to receive and propagate a reference clock of the clock distribution network, each of the plurality of drive elements further configured to be selectively enabled by a corresponding enable signal; and
    a resonance switch electrically coupled to the clock node, the resonance switch configured to selectively enable a resonant mode of operation of the resonant clock driver;
    wherein, the resonant clock driver selectively controls an overall drive strength of the plurality of drive elements as a function of a current mode of operation of the resonant clock driver, wherein the current mode of operation is either a resonant mode or a non-resonant mode as indicated by the resonance switch, and wherein the drive strength at a given instant is a function of a total number of drive elements enabled by the resonant clock driver at the given instant.

2. The resonant clock driver of claim 1, wherein the enable signal for each of the plurality of drive elements is supplied via a pre-driver circuit setup.

3. The resonant clock driver of claim 1, wherein, when the current mode of operation switches from the resonant mode to the non-resonant mode, the resonant clock driver increases the overall drive strength such that a resultant amplitude and resultant rise and/or fall time value during the non-resonant mode of operation is approximately equal to an initial amplitude and initial rise and/or fall time value that existed during the resonant mode of operation.

4. The resonant clock driver of claim 1, wherein, when the current mode of operation switches from the resonant mode to the non-resonant mode, the resonant clock driver increases the overall drive strength to achieve a desired amplitude and rise and/or fall time value of a resultant clock signal.

5. The resonant clock driver of claim 4, wherein the resonant clock driver increases the overall drive strength by selectively increasing a total number of enabled drive elements such that a resultant drive strength corresponds to the desired amplitude and rise and/or fall time value of the resultant clock signal.

6. The resonant clock driver of claim 1, wherein, when the current mode of operation switches from the non-resonant mode to the resonant mode, the resonant clock driver decreases the overall drive strength to achieve a desired amplitude and rise and/or fall time value of a resultant clock signal.

7. The resonant clock driver of claim 6, wherein the resonant clock driver decreases the overall drive strength by selectively decreasing a total number of enabled drive elements such that a resultant drive strength corresponds to the desired amplitude and rise and/or fall time value of the resultant clock signal.

8. The resonant clock driver of claim 1, wherein each of the plurality of drive elements includes a pull-up element and a pull-down element for driving a resultant clock signal.

9. The resonant clock driver of claim 1, wherein the resonant clock driver, by controlling the overall drive strength as a function of the current mode of operation, effectively controls an amplitude and a rise and/or fall time of a resultant clock signal as a function of the current mode of operation.

10. The resonant clock driver of claim 9, wherein the reference clock includes a pull-up reference clock and a pull-down reference clock, wherein the pull-up reference clock is supplied to a pull-up element of each of the plurality of drive elements, and wherein the pull-down reference clock is supplied to a pull-down element of each of the plurality of drive elements.

11. The resonant clock driver of claim 10, wherein a first duty cycle of the pull-up reference clock and a second duty cycle of the pull-down reference clock are set to specific values by the clock distribution network prior to being supplied to the plurality of drive elements, wherein the specific values are determined based on a desired amplitude and a desired rise and/or fall value of each of the pull-up and pull-down reference clocks.

12. The resonant clock driver of claim 9, wherein the resonant clock driver includes an inductive element configured to effectuate the resonant mode of operation when the resonance switch is enabled.

13. The resonant clock driver of claim 12, wherein the resonance switch is a transmission gate with an NMOS device and a PMOS device electrically coupled between the inductive element and a mid-point supply associated with the inductive element.

14. The resonant clock driver of claim 12, wherein the resonance switch is a transmission gate with an NMOS device and a PMOS device electrically coupled between the inductive element and the clock node.

15. The resonant clock driver of claim 12, wherein the resonance switch includes:
a PMOS device electrically coupled between a power rail and a mid-point node of a power supply associated with the inductive element; and
an NMOS device electrically coupled between the mid-point node and a ground rail of the power supply.

16. A method of operation of a resonant clock driver for a clock distribution network, the method comprising:
electrically coupling a plurality of drive elements to a clock node of the resonant clock driver, each of the plurality of drive elements configured to receive and propagate a reference clock of the clock distribution network, each of the plurality of drive elements further configured to be selectively enabled by a corresponding enable signal;
electrically coupling a resonance switch to the clock node, the resonance switch configured to selectively enable a resonant mode of operation of the resonant clock driver; and
selectively controlling an overall drive strength of the plurality of drive elements as a function of a current mode of operation of the resonant clock driver, wherein the current mode of operation is either a resonant mode or a non-resonant mode as indicated by the resonance switch, and wherein the drive strength at a given instant is a function of a total number of drive elements enabled by the resonant clock driver at the given instant.

17. The method of claim 16, further comprising:
by controlling the overall drive strength as a function of the current mode of operation, effectively controlling an amplitude and a rise and/or fall time of a resultant clock signal as a function of the current mode of operation.

18. The method of claim 16, further comprising:
when the current mode of operation switches from the resonant mode to the non-resonant mode, increasing the overall drive strength such that a resultant amplitude and resultant rise and/or fall time value during the non-resonant mode of operation is approximately equal to an initial amplitude and initial rise and/or fall time value that existed during the resonant mode of operation.

19. The method of claim 16, further comprising:
when the current mode of operation switches from the resonant mode to the non-resonant mode, increasing the overall drive strength to achieve a desired amplitude and rise and/or fall time value of a resultant clock signal.

20. The method of claim 19, further comprising:
increasing the overall drive strength by selectively increasing a total number of enabled drive elements such that a resultant drive strength corresponds to the desired amplitude and rise and/or fall time value of the resultant clock signal.

21. The method of claim 16, further comprising:
when the current mode of operation switches from the non-resonant mode to the resonant mode, decreasing the overall drive strength to achieve a desired amplitude and rise and/or fall time value of a resultant clock signal.

22. The method of claim 21, further comprising:
decreasing the overall drive strength by selectively decreasing a total number of enabled drive elements such that a resultant drive strength corresponds to the desired amplitude and rise and/or fall time value of the resultant clock signal.

23. A resonant clock driver for a clock distribution network, comprising:
a plurality of drive elements electrically coupled to a clock node of the resonant clock driver, each of the plurality of drive elements configured to receive and propagate a reference clock of the clock distribution network, each of the plurality of drive elements further configured to be selectively enabled by a corresponding enable signal; and
a resonance switch electrically coupled to the clock node, the resonance switch configured to selectively enable a resonant mode of operation of the resonant clock driver;
wherein the resonant clock driver selectively controls an overall drive strength of the plurality of drive elements as a function of a current mode of operation of the resonant clock driver, the current mode of operation is either a resonant mode or a non-resonant mode as indicated by the resonance switch, and the drive strength at a given instant is a function of a total number of drive elements enabled by the resonant clock driver at the given instant;
further wherein the resonance switch includes:
a PMOS device electrically coupled between a power rail and a mid-point node of a power supply associated with an inductive element; and
an NMOS device electrically coupled between the mid-point node and a ground rail of the power supply; and
further wherein the reference clock includes a pull-up reference clock and a pull-down reference clock, wherein the pull-up reference clock is supplied to a pull-up element of each of the plurality of drive elements and the pull-down reference clock is supplied to a pull-down element of each of the plurality of drive elements, wherein a first duty cycle of the pull-up reference clock and a second duty cycle of the pull-down reference clock are set to specific values by the clock distribution network prior to being supplied to the plurality of driver drive elements, wherein the specific values are determined based on a desired amplitude and a desired rise and/or fall value of each of the pull-up and pull-down reference clocks.

* * * * *